(12) United States Patent
Suzuki

(10) Patent No.: US 11,164,630 B2
(45) Date of Patent: Nov. 2, 2021

(54) SEMICONDUCTOR MEMORY DEVICE

(71) Applicant: Kioxia Corporation, Minato-ku (JP)

(72) Inventor: Shinji Suzuki, Sagamihara (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/926,977

(22) Filed: Jul. 13, 2020

(65) Prior Publication Data

US 2021/0082505 A1  Mar. 18, 2021

(30) Foreign Application Priority Data

Sep. 17, 2019  (JP) .............................. JP2019-168394

(51) Int. Cl.
*G11C 16/04* (2006.01)
*G11C 16/08* (2006.01)
*G11C 16/16* (2006.01)
*G11C 16/24* (2006.01)
*G11C 16/34* (2006.01)

(52) U.S. Cl.
CPC .......... *G11C 16/0483* (2013.01); *G11C 16/08* (2013.01); *G11C 16/16* (2013.01); *G11C 16/24* (2013.01); *G11C 16/3436* (2013.01)

(58) Field of Classification Search
CPC ..... G11C 16/0483; G11C 16/08; G11C 16/16; G11C 16/24; G11C 16/3436; G11C 16/10; G11C 16/3459; G11C 11/5628; G11C 16/26

See application file for complete search history.

(56) References Cited

U.S. PATENT DOCUMENTS

| 7,760,551 B2 | 7/2010 | Park et al. |
| 7,804,712 B2 | 9/2010 | Kim et al. |
| 7,864,581 B2 | 1/2011 | Lee |
| 2008/0158985 A1* | 7/2008 | Mokhlesi ........... G11C 16/0483 365/185.21 |
| 2013/0229868 A1* | 9/2013 | Koh .................... G11C 11/5685 365/185.03 |

FOREIGN PATENT DOCUMENTS

| JP | 2006-294207 A | 10/2006 |
| JP | 2009-20995 A | 1/2009 |
| JP | 2009-70549 A | 4/2009 |

\* cited by examiner

*Primary Examiner* — Gene N Auduong
(74) *Attorney, Agent, or Firm* — Oblon, McClelland, Maier & Neustadt, L.L.P.

(57) ABSTRACT

A semiconductor device according to an embodiment includes first and second drain select transistors, first and second source select transistors, first and second memory cell transistors, third and fourth memory cell transistors, first and second bit lines, first to third select gate line, first and second word lines, and a controller. The controller is configured to execute, in the program loop, a program operation, a recovery operation and a verify operation in sequence. In the write operation of the first memory cell transistor, the controller is configured, at a first time of the recovery operation, to: apply a first voltage to the first select gate line; apply a second voltage to the third select gate line; and apply a third voltage to the first bit line.

20 Claims, 23 Drawing Sheets

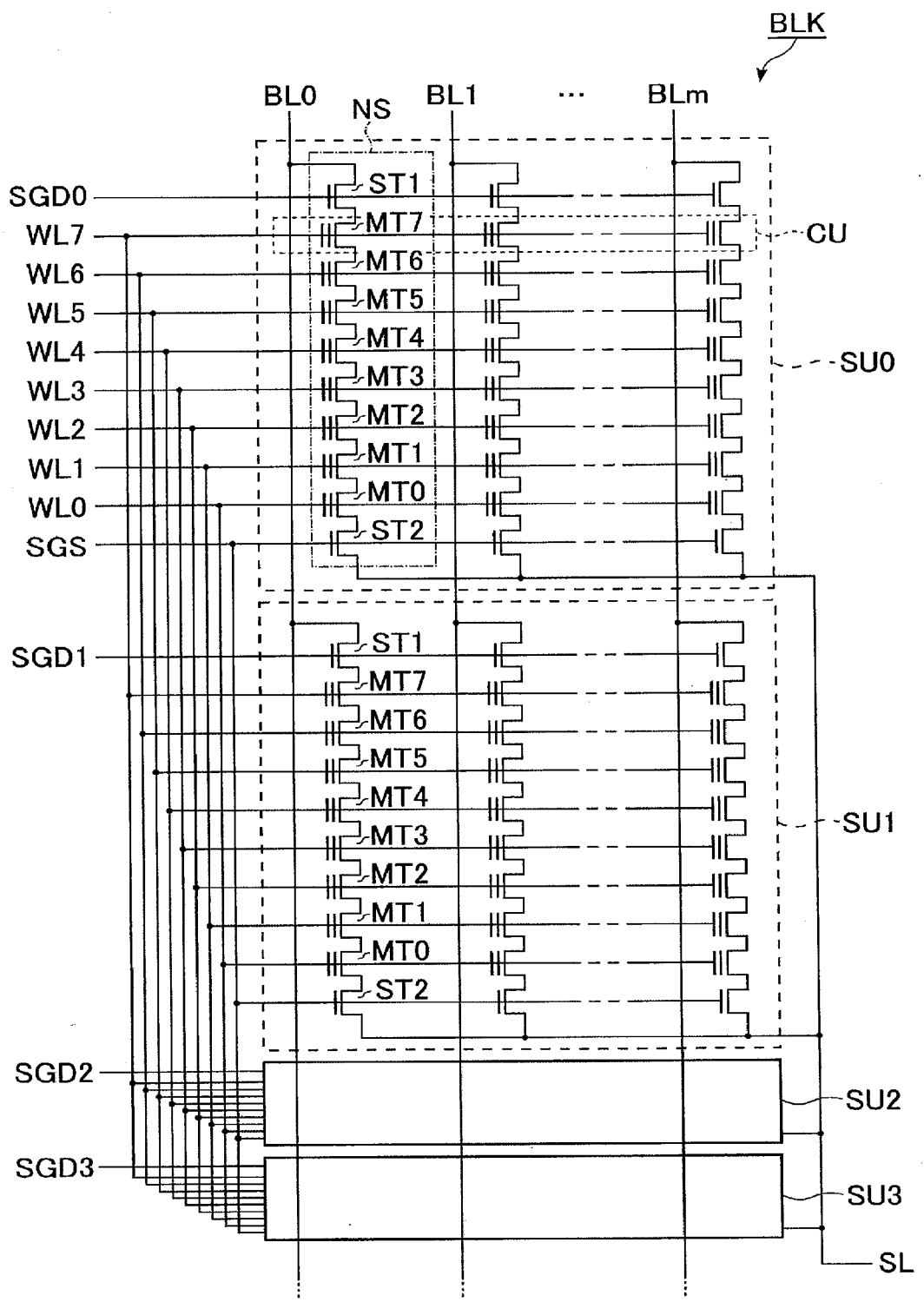
F I G. 2

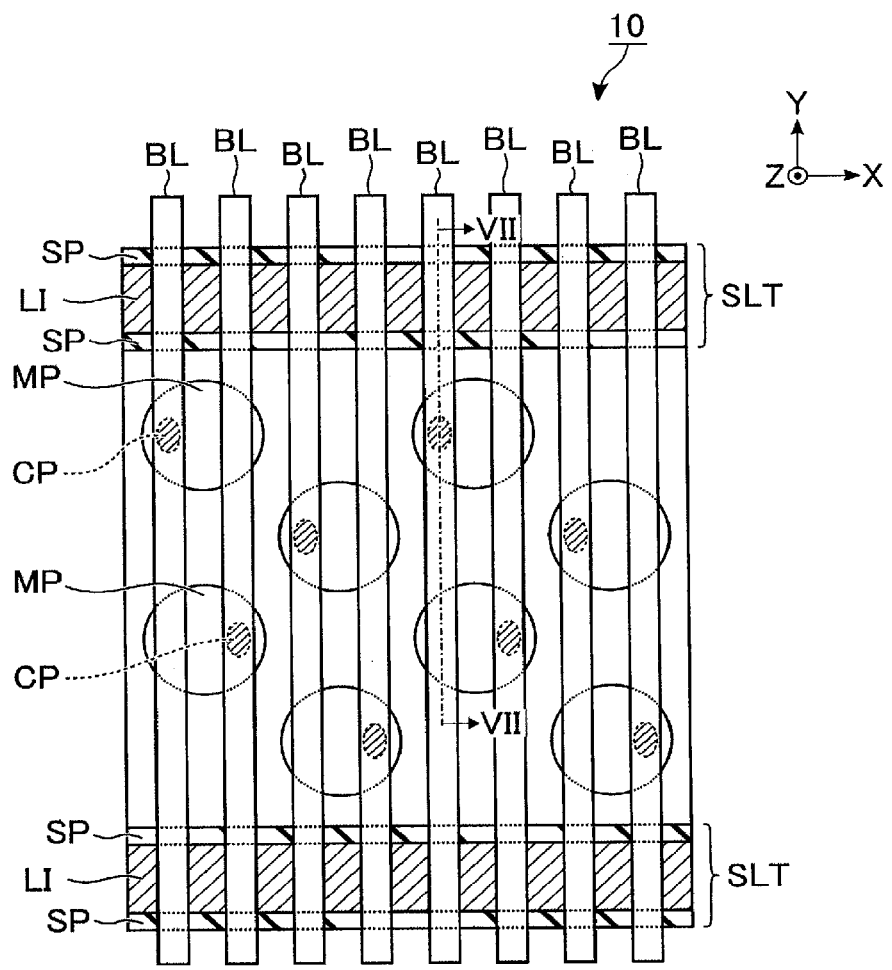
F I G. 6

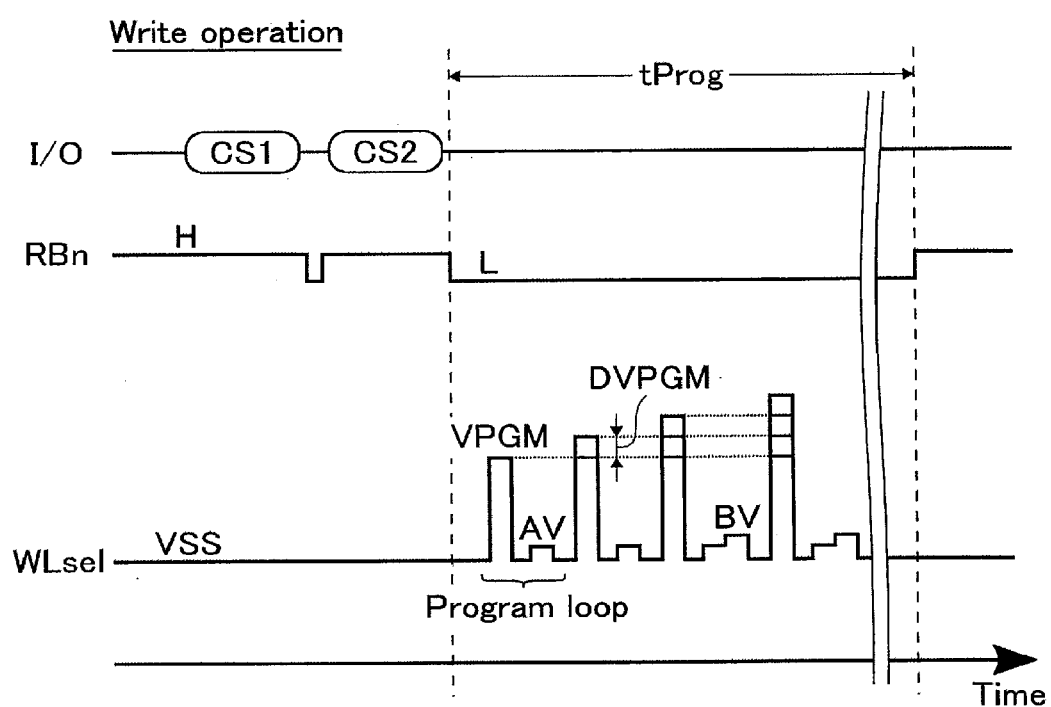
F I G. 10

Data retention
(1) Threshold voltage distribution immediately after program operation
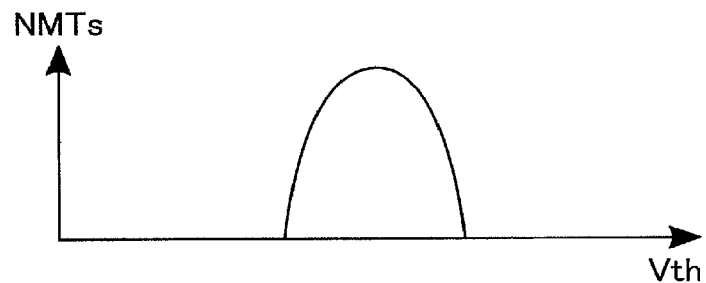
(2) Threshold voltage distribution during verify operation
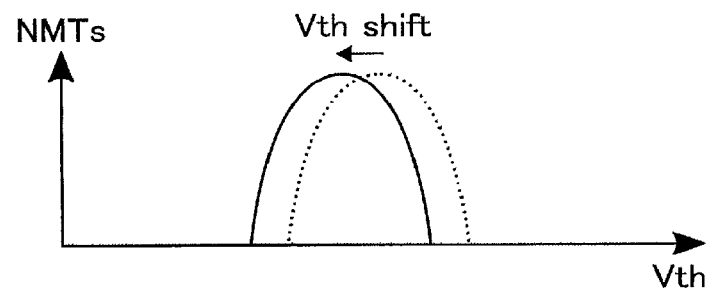
F I G. 12

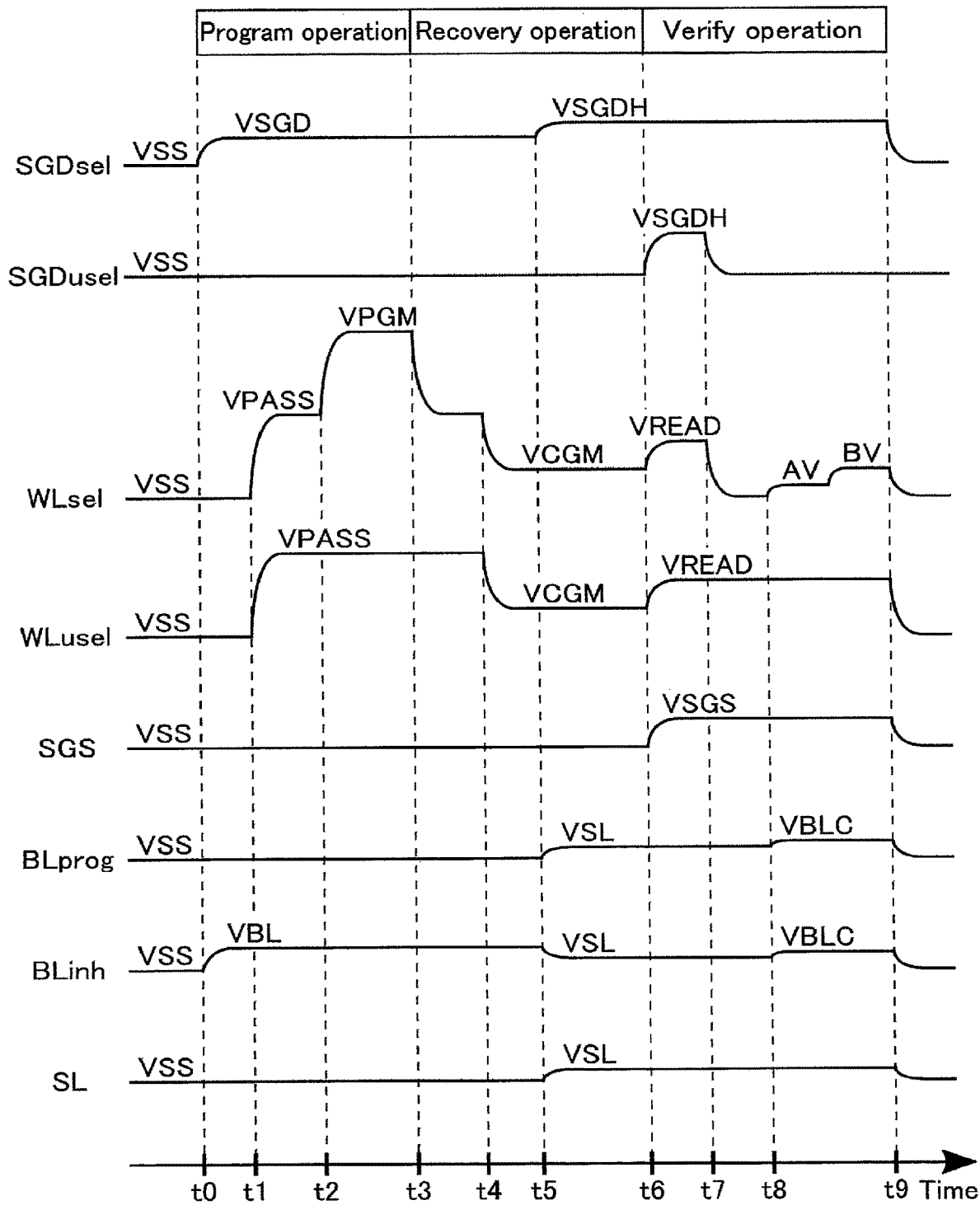
F I G. 14

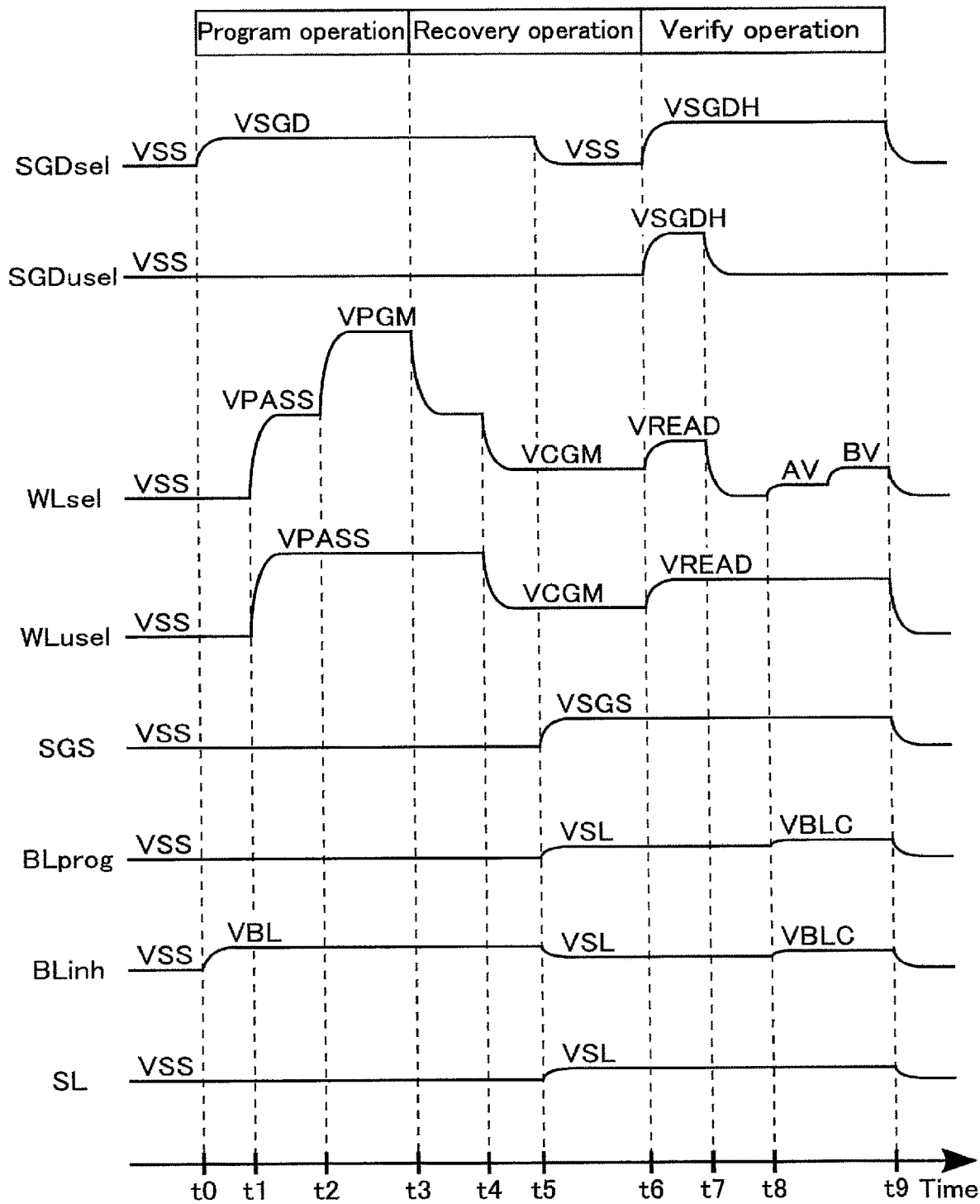
F I G. 16

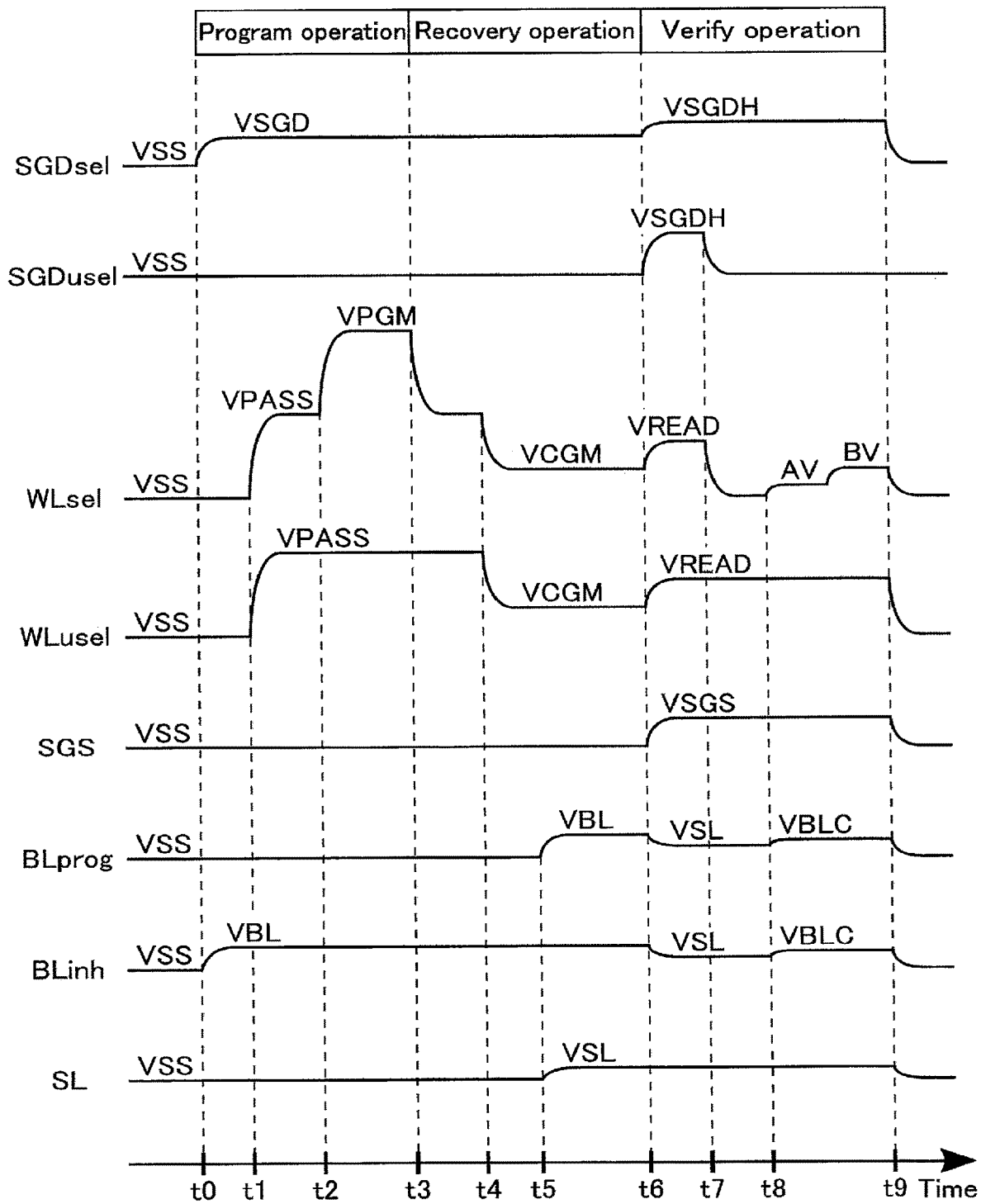
F I G. 17

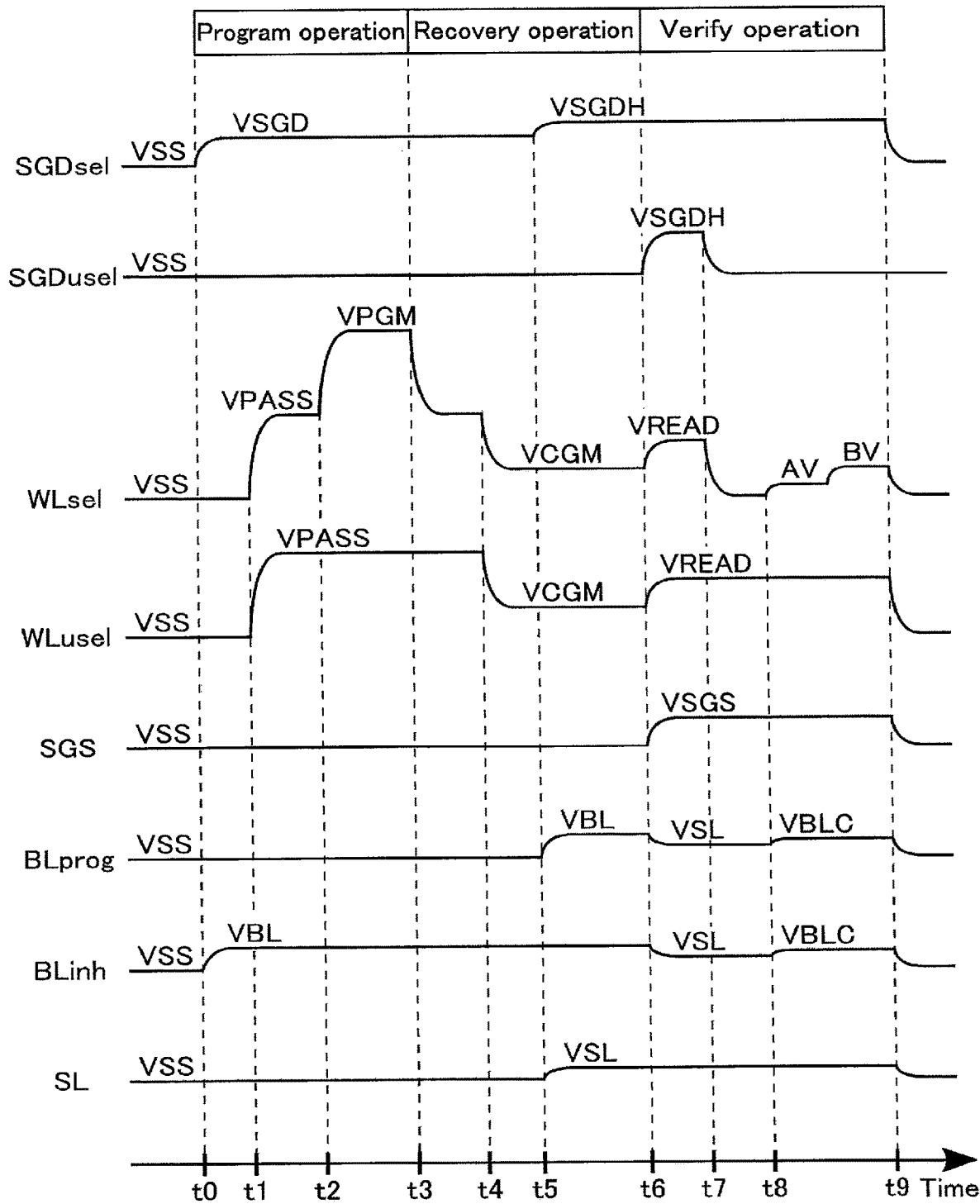
F I G. 18

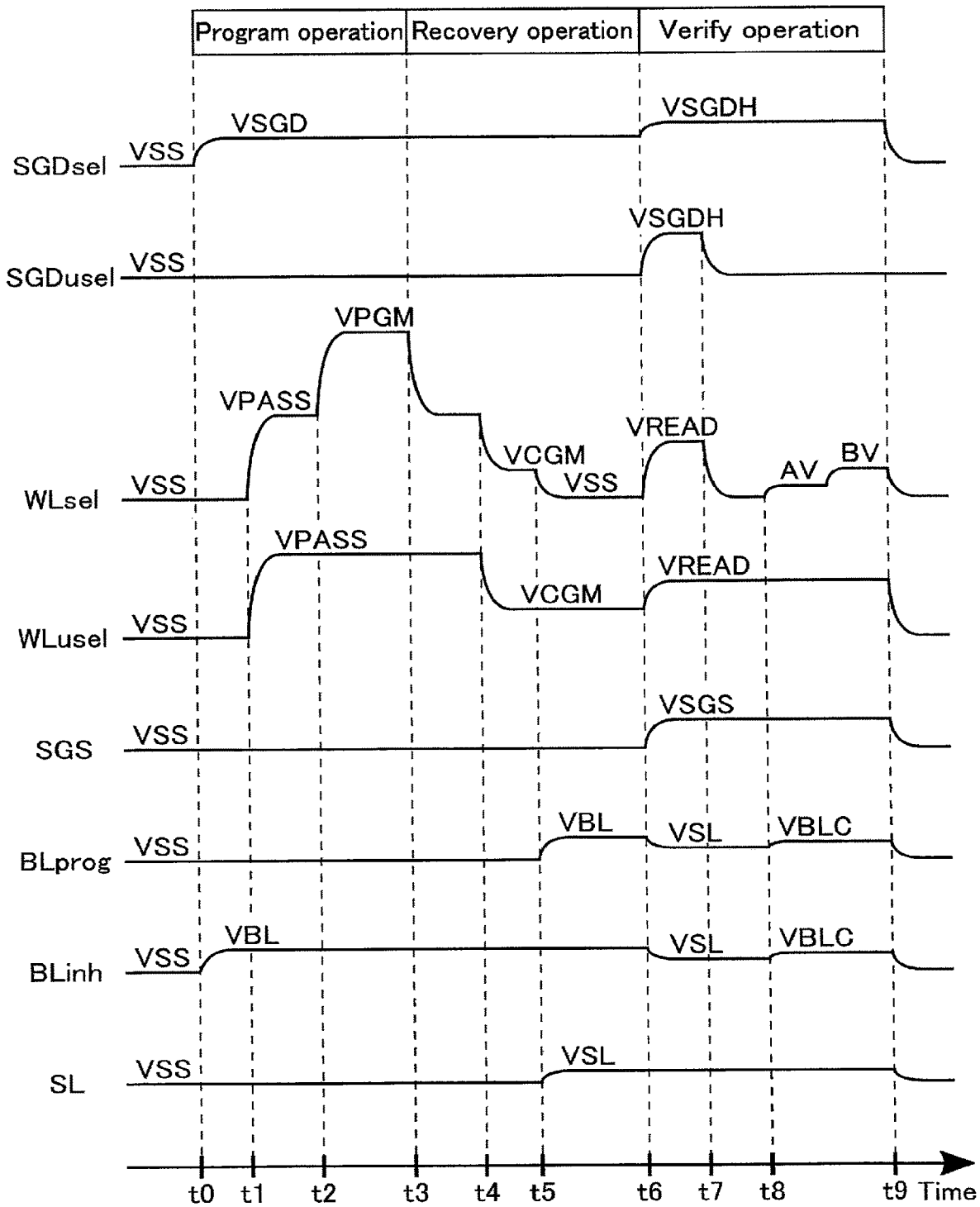
F I G. 19

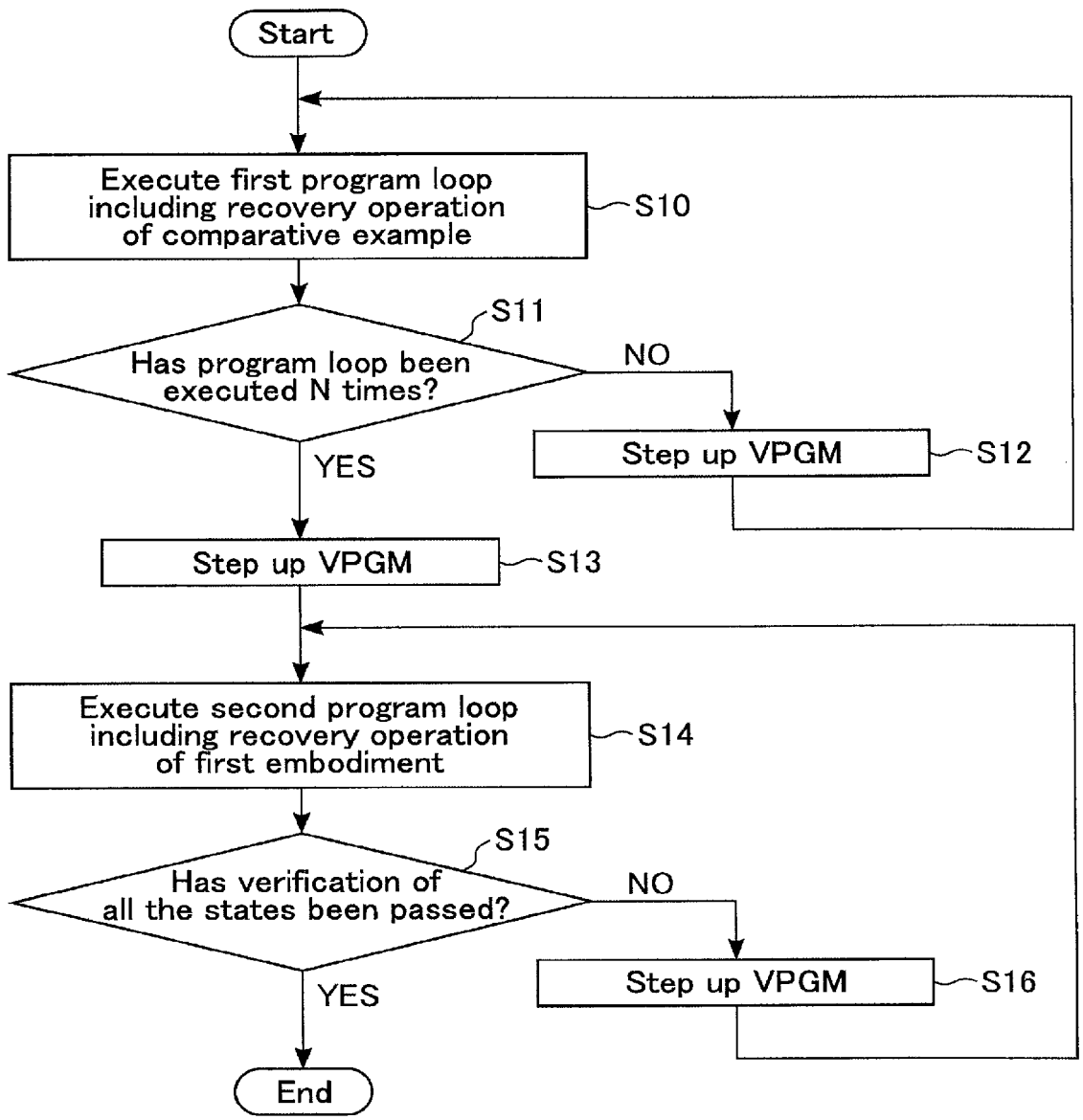
F I G. 24

SEMICONDUCTOR MEMORY DEVICE

CROSS-REFERENCE TO RELATED APPLICATIONS

This application is based upon and claims the benefit of priority from Japanese Patent Application No. 2019-168394, filed Sep. 17, 2019, the entire contents of which are incorporated herein by reference.

FIELD

Embodiments described herein relate generally to a semiconductor memory device.

BACKGROUND

There is known a NAND-type flash memory that is capable of storing data in a nonvolatile manner.

BRIEF DESCRIPTION OF THE DRAWINGS

FIG. 2 is a circuit diagram illustrating an example of a circuit configuration of a memory cell array included in the semiconductor memory device according to the first embodiment;

FIG. 6 is a plan view illustrating an example of a planar layout of a memory cell array included in the semiconductor memory device according to the first embodiment;

FIG. 10 is a timing chart illustrating an example of how a write operation is performed in the semiconductor memory device according to the first embodiment;

FIG. 12 is a threshold distribution diagram illustrating an example of the threshold distribution of a memory cell transistor in the program loop in a write operation of the semiconductor memory device;

FIG. 14 is a timing chart illustrating an example of a program loop in a semiconductor memory device according to a first modification of the first embodiment;

FIG. 16 is a timing chart illustrating an example of a program loop in a semiconductor memory device according to a third modification of the first embodiment;

FIG. 17 is a timing chart illustrating an example of a semiconductor memory device according to a second embodiment;

FIG. 18 is a timing chart illustrating an example of a program loop in a semiconductor memory device according to a first modification of the second embodiment;

FIG. 19 is a timing chart illustrating an example of a program loop in a semiconductor memory device according to a second modification of the second embodiment;

FIG. 24 is a flowchart illustrating an example of a write operation in a semiconductor memory device according to a fourth embodiment.

DETAILED DESCRIPTION

Figure 1:
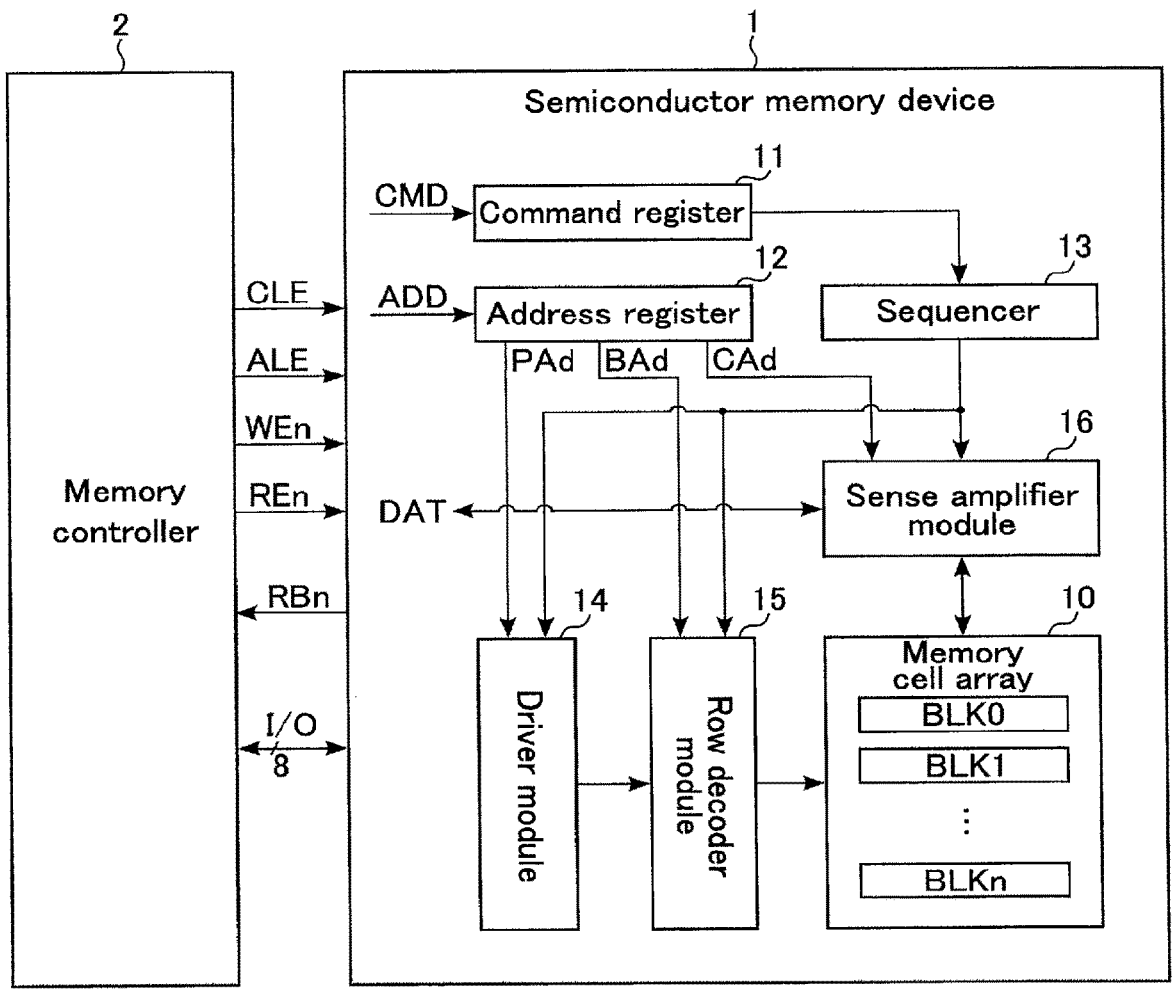
FIG. 1 is a block diagram illustrating a configuration example of a semiconductor memory device according to a first embodiment.

In general, according to one embodiment, a semiconductor memory device includes first and second drain select transistors, first and second source select transistors, first and second memory cell transistors, third and fourth memory cell transistors, first and second bit lines, first to third select gate line, first and second word lines, and a controller. The first and second memory cell transistors are coupled between the first drain select transistor and the first source select transistor. The third and fourth memory cell transistors are coupled between the second drain select transistor and the second source select transistor. The first and second bit lines are coupled to the first and second drain select transistors, respectively. The first select gate line is coupled to the first drain select transistor. The second select gate line is coupled to the second drain select transistor. The third select gate line is coupled to the first and second source select transistors. The first word line is coupled to the first and third memory cell transistors. The second word line is coupled to the second and fourth memory cell transistors. The controller is configured to execute a write operation including multiple iterations of a program loop. The controller is configured to execute, in the program loop, a program operation, a recovery operation and a verify operation in sequence. In the write operation of the first memory cell transistor, the controller is configured, at a first time of the recovery operation, to: apply a first voltage to the first select gate line; apply a second voltage which is lower than the first voltage to the third select gate line; and apply a third voltage between the first voltage and the second voltage to the first bit line. The first word line and the second word line are provided apart from each other above a substrate in a direction intersecting with a surface of the substrate.

Hereinafter, embodiments will be described with reference to the accompanying drawings. Each embodiment exemplifies a device and a method for embodying the technical idea of the invention. The drawings are schematic or conceptual, and the dimensions, ratios, etc. in the drawings are not necessarily the same as those of actual products. The technical idea underlying the present invention is not limited by the shapes, structures, arrangements, etc. of the structural elements.

In the description below, elements having substantially the same functions and configurations will be denoted by the same reference symbols. The numbers after the letters of reference symbols are used to distinguish between elements that have the same structure and that are referenced by reference signs that contain the same characters. Where elements denoted by reference symbols including the same letters need not be discriminated from each other, they will be denoted by reference symbols including only letters.

[1] First Embodiment

A semiconductor memory device 1 according to a first embodiment will be described.

[1-1] Configuration of Semiconductor Memory Device 1

[1-1-1] Overall Configuration of Semiconductor Memory Device 1

FIG. 1 illustrates a configuration example of the semiconductor memory device 1 according to the first embodiment. The semiconductor memory device 1 is a NAND-type flash memory capable of storing data in a nonvolatile manner and is controlled by an external memory controller 2. As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK includes an aggregation of a plurality of memory cells capable of storing data in a nonvolatile manner, and is used, for example, as a data erase unit. The memory cell array 10 is provided with a plurality of bit lines and a plurality of word lines. For example, each memory cell is associated with one bit line and one word line. A detailed configuration of the memory cell array 10 will be described later.

The command register 11 holds a command CMD which the semiconductor memory device 1 receives from the memory controller 2. The command CMD includes, for example, an instruction to cause the sequencer 13 to execute a read operation, a write operation, an erase operation, etc.

The address register 12 holds address information ADD which the semiconductor memory device 1 receives from the memory controller 2. The address information ADD includes, for example, a block address BAd, a page address PAd, and a column address CAd. For example, the block address BAd, the page address PAd, and the column address CAd are used to select a block BLK, a word line and a bit line, respectively.

The sequencer 13 controls the overall operation of the semiconductor memory device 1. For example, the sequencer 13 controls the driver module 14, row decoder module 15, sense amplifier module 16, etc., based on the command CMD held in the command register 11, to execute a read operation, a write operation, an erase operation, etc.

The driver module 14 generates voltages used in the read operation, write operation, erase operation, etc. Also, the driver module 14 applies the generated voltages to a signal line corresponding to a selected word line, based on, for example, the page address PAd held in the address register 12.

The row decoder module 15 selects one of blocks BLK in the corresponding memory cell array 10, based on the block address BAd held in the address register 12. Also, the row decoder module 15 transfers, for example, the voltage applied to the signal line corresponding to the selected word line to the selected word line in the selected block BLK.

The sense amplifier module 16 applies a desired voltage to each bit line in accordance with write data DAT that is received from the memory controller 2 in the write operation. Furthermore, in the read operation, the sense amplifier module 16 determines what data is stored in the memory cell, based on the voltage of the bit line, and transfers a determination result to the memory controller 2 as read data DAT.

Communications between the semiconductor memory device 1 and the memory controller 2 support, for example, the NAND interface standard. For example, in the communications between the semiconductor memory device 1 and the memory controller 2, a command latch enable signal CLE, an address latch enable signal ALE, a write enable signal WEn, a read enable signal REn, a ready/busy signal RBn, and an input/output signal I/O are used.

The command latch enable signal CLE is a signal indicating that the input/output signal I/O received by the semiconductor memory device 1 is a command CMD. The address latch enable signal ALE is a signal indicating that the input/output signal I/O received by the semiconductor memory device 1 is address information ADD. The write enable signal WEn is a signal that instructs the semiconductor memory device 1 to input the input/output signal I/O. The read enable signal REn is a signal that instructs the semiconductor memory device 1 to output the input/output signal I/O. The ready/busy signal RBn is a signal that notifies the memory controller 2 whether the semiconductor memory device 1 is in a ready state or in a busy state. The ready state is a state where the semiconductor memory device 1 accepts an instruction, and the busy state is a state where the semiconductor memory device 1 does not accept an instruction. The input/output signal I/O is, for example, an 8-bit signal and can include a command CMD, address information ADD, data DAT, etc.

The semiconductor memory device 1 and memory controller 2 described above may constitute one semiconductor device by combining them together. Examples of such a semiconductor device include a memory card such as an SD™ card, and a solid state drive (SSD).

[1-1-2] Circuit Configuration of Semiconductor Memory Device 1

(Circuit Configuration of Memory Cell Array 10)

FIG. 2 illustrates an example of a circuit configuration of the memory cell array 10 included in the semiconductor memory device 1 according to the first embodiment, by extracting one block BLK out of the plurality of blocks BLK included in the memory cell array 10. As illustrated in FIG. 2, the block BLK includes, for example, four string units SU0 to SU3.

Each string unit SU includes a plurality of NAND strings NS respectively associated with bit lines BL0 to BLm (m is an integer of 1 or more). Each NAND string NS includes, for example, memory cell transistors MT0 to MT7, and select transistors ST1 and ST2. Each of the memory cell transistors MT includes a control gate and a charge storage layer and holds data in a nonvolatile manner. The select transistors ST1 and ST2 are respectively used for selecting a string unit SU during various operations.

In each NAND string NS, the memory cell transistors MT0 to MT7 are coupled in series. The drain of the select transistor ST1 is coupled to an associated bit line BL, and the source of the select transistor ST1 is coupled to one end of serially coupled memory cell transistors MT0 to MT7. The drain of the select transistor ST2 is coupled to the other end of the serially coupled memory cell transistors MT0 to MT7. The source of the select transistor ST2 is coupled to a source line SL.

In the same block BLK, the control gates of memory cell transistors MT0 to MT7 are commonly coupled to word lines WL0 to WL7, respectively. The gates of select transistors ST1 in string units SU0 to SU3 are commonly coupled to select gate lines SGD0 to SGD3, respectively. The gates of select transistors ST2 included in the same block BLK are commonly coupled to select gate line SGS.

In the circuit configuration of the memory cell array 10 described above, the bit line BL is shared by the NAND strings NS to which the same column address is assigned in each string unit SU. The source line SL is shared, for example, by a plurality of blocks BLK.

A set of a plurality of memory cell transistors MT coupled to a common word line WL in one string unit SU are referred to, for example, as a cell unit CU. For example, the storage capacity of the cell unit CU including memory cell transistors MT each storing 1-bit data is defined as "1 page data". The cell unit CU may have a storage capacity of two-page data or more in accordance with the number of bits of data to be stored in the memory cell transistor MT.

The circuit configuration of the memory cell array 10 included in the semiconductor memory device 1 according to the first embodiment is not limited to the configuration described above. For example, the number of string units SU included in each block BLK, the number of memory cell transistors MT included in each NAND string NS, and the number of select transistors ST1 and ST2 included in each NAND string NS may be designed to be any number.

(Circuit Configuration of Row Decoder Module 15)

Figure 3:
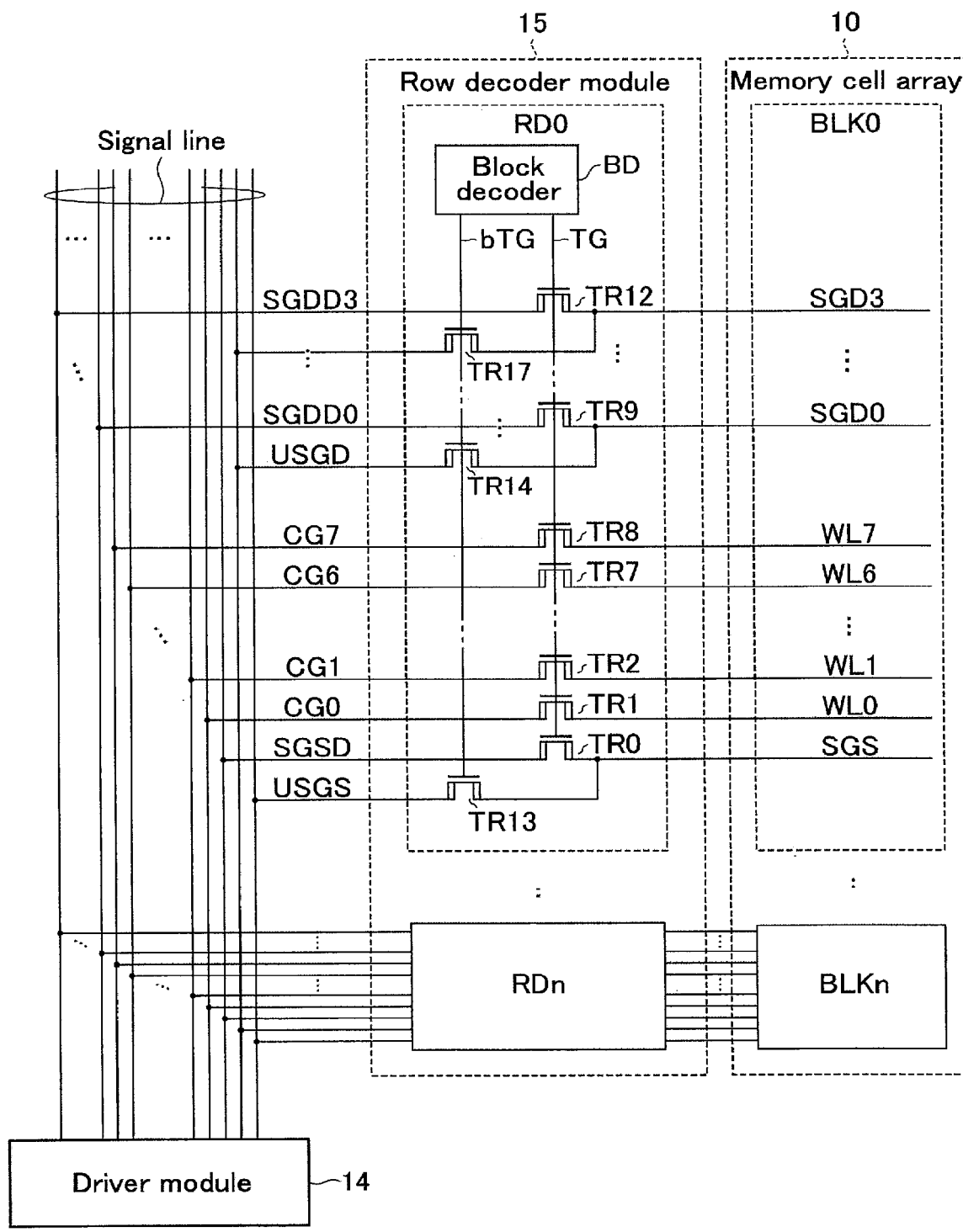
FIG. 3 is a circuit diagram illustrating an example of a circuit configuration of a row decoder module included in the semiconductor memory according to the first embodiment.

FIG. 3 illustrates an example of a circuit configuration of the row decoder module 15 included in the semiconductor memory device 1 according to the first embodiment. As illustrated in FIG. 3, the row decoder module 15 includes, for example, row decoders RD0 to RDn and is coupled to the driver module 14 via signal lines CG0 to CG7, SGDD0 to SGDD3, SGSD, USGD and USGS.

In the description below, a detailed circuit configuration of the row decoder RD will be described by focusing on a row decoder RD0 corresponding to block BLK0. The row decoder RD includes, for example, a block decoder BD, transfer gate lines TG and bTG, and transistors TR0 to TR17.

The block decoder BD decodes the block address BAd. The block decoder BD applies predetermined voltages to the transfer gate lines TG and bTG, respectively, based on the decoding result. The voltage applied to the transfer gate line TG and the voltage applied to the transfer gate line bTG have a complementary relationship. In other words, the inverted signal of a signal of the transfer gate line TG is input to the transfer gate line bTG.

Each of the transistors TR0 to TR17 is a high breakdown voltage N-type MOS transistor. The gates of the transistors TR0 to TR12 are commonly coupled to the transfer gate line TG. The gates of the transistors TR13 to TR17 are commonly coupled to the transfer gate line bTG. Each transistor TR is coupled between the signal lines extending from the driver module 14 and the interconnects provided in the corresponding block BLK.

Specifically, the drain of the transistor TR0 is coupled to the signal line SGSD. The source of the transistor TR0 is coupled to the select gate line SGS. The drains of the transistors TR1 to TR8 are coupled to the signal lines CG0 to CG7, respectively. The sources of transistors TR1 to TR8 are coupled to the word lines WL0 to WL7, respectively. The drains of the transistors TR9 to TR12 are coupled to the signal lines SGDD0 to SGDD3, respectively. The drains of the transistors TR9 to TR12 are coupled to the select gate lines SGD0 to SGD3, respectively. The drain of the transistor TR13 is coupled to the signal line USGS. The source of the transistor TR13 is coupled to the select gate line SGS. The drains of the transistors TR14 to TR17 are commonly coupled to the signal line USGD. The sources of the transistors TR14 to TR17 are coupled to the select gate lines SGD0 to SGD3, respectively.

That is, the signal lines CG0 to CG7 are used as a global word line shared by a plurality of blocks BLK, and the word lines WL0 to WL7 are used as local word lines provided for the respective blocks. The signal lines SGDD0 to SGDD3 and SGSD are used as a global gate line shared by the plurality of blocks BLK, and the select gate lines SGD0 to SGD3 and SGS are used as local transfer gate lines provided for each block BLK.

With the above configuration, the row decoder module 15 can select a block BLK. Specifically, in various operations, the block decoder BD corresponding to the selected block BLK applies "H" level and "L" level voltages to the transfer gate lines TG and bTG, respectively, and the block decoder BD corresponding to a non-selected block BLK applies "L" level and "H" level voltages to the transfer gate lines TG and bTG, respectively.

The circuit configuration of the row decoder module 15 described above is merely an example and can be modified as appropriate. For example, the number of transistors TR included in the row decoder module 15 is designed based on the number of interconnects provided in each block BLK.

(Circuit Configuration of Sense Amplifier Module 16)

Figure 4:
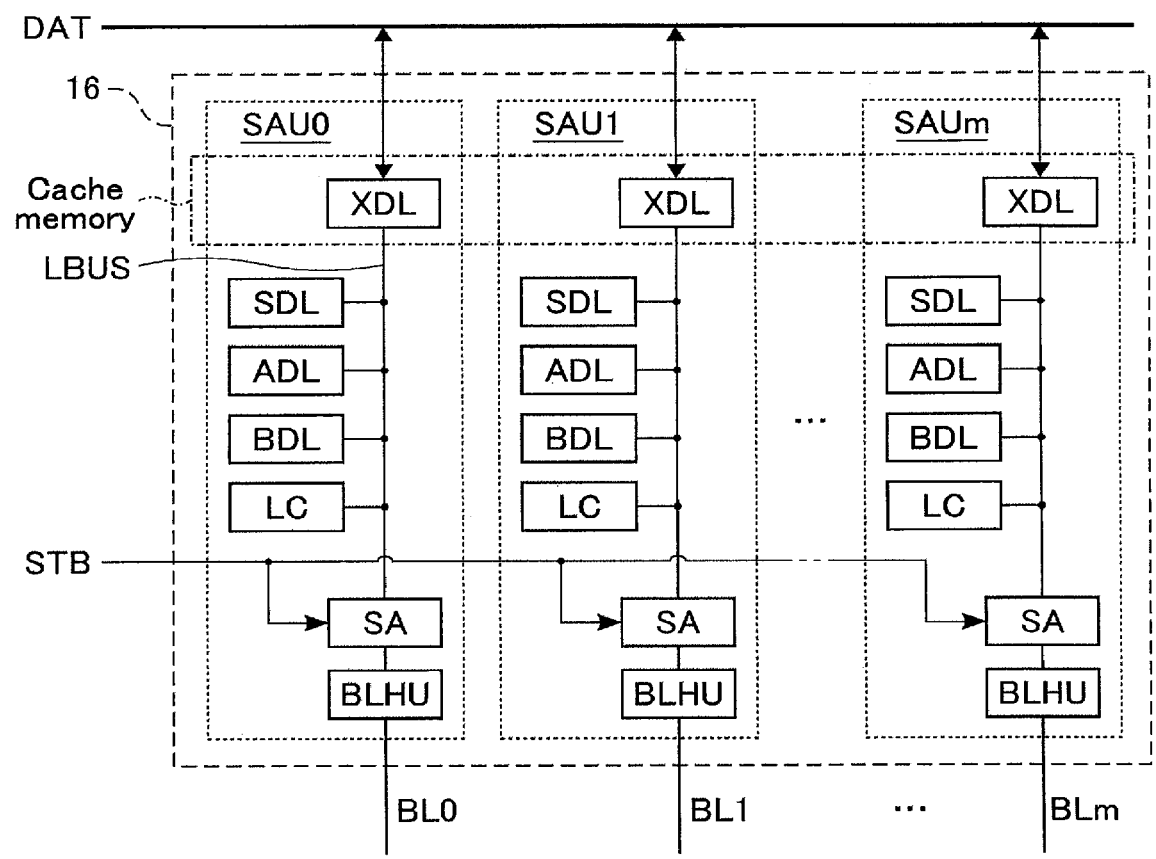
FIG. 4 is a circuit diagram illustrating an example of a circuit configuration of a sense amplifier module included in the semiconductor memory device according to the first embodiment.

FIG. 4 illustrates an example of a circuit configuration of the sense amplifier module 16 included in the semiconductor memory device 1 according to the first embodiment. As illustrated in FIG. 4, each sense amplifier unit SAU includes, for example, a bit line coupling unit BLHU, a sense amplifier SA, a logic circuit LC, and latch circuits SDL, ADL, BDL and XDL.

The bit line coupling unit BLHU includes a high-breakdown-voltage transistor coupled between the associated bit line BL and the sense amplifier SA. The sense amplifier SA, the logic circuit LC, and the latch circuits SDL, ADL, BDL and XDL are commonly coupled to a bus LBUS. The latch circuits SDL, ADL, BDL and XDL can transmit/receive data to/from each other.

For example, a control signal STB generated by the sequencer 13 is input to each sense amplifier SA. Each sense amplifier unit SA determines whether the data read to the associated bit line BL is "0" or "1", based on the timing at which the control signal STB is asserted. That is, the sense amplifier SA determines data stored in the selected memory cell based on the voltage of the bit line BL.

The logic circuit LC performs various logic operations, using data that are held in the latch circuits SDL, ADL, BDL and XDL coupled to the common bus LBUS. Specifically, the logic circuit LC can execute an AND operation, an OR operation, a NAND operation, a NOR operation, an EXNOR operation, or the like, using data held in two latch circuits.

Each of the latch circuits SDL, ADL, BDL and XDL temporarily holds data. Latch circuit XDL is used for the input/output of data DAT between the input/output circuit of the semiconductor memory device 1 and the sense amplifier unit SAU. The latch circuit XDL can also be used as, for example, a cache memory of the semiconductor memory device 1. The semiconductor memory device 1 can be in the ready state, at least when the latch circuit XDL is vacant.

Figure 5:
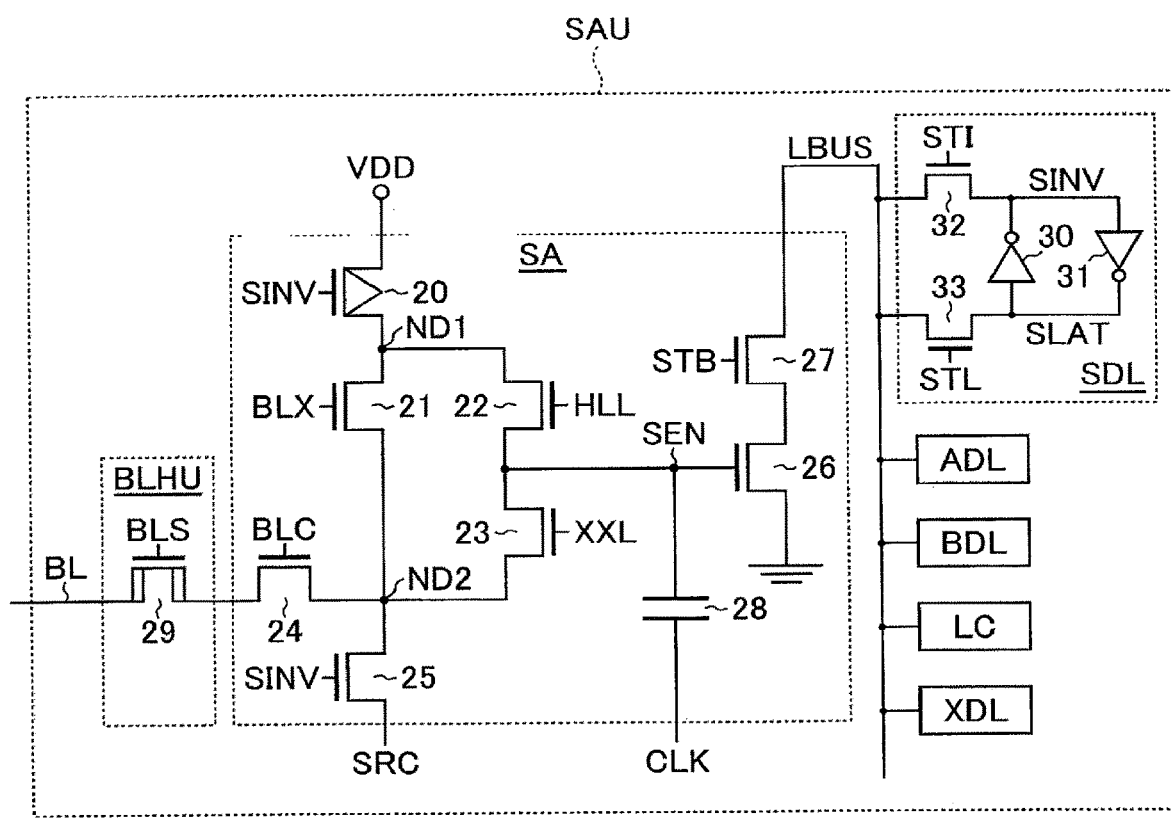
FIG. 5 is a circuit diagram illustrating an example of a circuit configuration of a sense amplifier unit included in the sense amplifier module included in the semiconductor memory device according to the first embodiment.

FIG. 5 illustrates an example of a circuit configuration of the sense amplifier unit SAU included in the semiconductor memory device 1 according to the first embodiment. As illustrated in FIG. 5, for example, the sense amplifier SA includes transistors 20 to 27 and a capacitor 28, and the bit line coupling unit BLHU includes transistor 29. The transistor 20 is a P-type MOS transistor. Each of the transistors 21 to 27 is an N-type MOS transistor. The transistor 29 is an N-type MOS transistor having a higher breakdown voltage than the transistors 20 to 27.

The source of the transistor 20 is coupled to a power supply line. The drain of the transistor 20 is coupled to a node ND1. The gate of the transistor 20 is coupled to, for example, a node SINV in the latch circuit SDL. The drain of the transistor 21 is coupled to a node ND1. The source of the transistor 21 is coupled to a node ND2. A control signal BLX is input to the gate of the transistor 21. The drain of the transistor 22 is coupled to a node ND1. The source of the transistor 22 is coupled to a node SEN. A control signal HLL is input to the gate of the transistor 22.

The drain of the transistor 23 is coupled to the node SEN. The source of the transistor 23 is coupled to a node ND2. A control signal XXL is input to the gate of the transistor 23. The drain of the transistor 24 is coupled to the node ND2. A control signal BLC is input to the gate of the transistor 24. The drain of the transistor 25 is coupled to the node ND2. The source of the transistor 25 is coupled to a node SRC. The gate of the transistor 25 is coupled to, for example, a node SINV in the latch circuit SDL.

The source of the transistor 26 is grounded. The gate of the transistor 26 is coupled to the node SEN. The drain of the transistor 27 is coupled to the bus LBUS. The source of the transistor 27 is coupled to the drain of the transistor 26. A control signal STB is input to the gate of the transistor 27. One electrode of the capacitor 28 is coupled to the node SEN. Clock CLK is input to the other electrode of the capacitor 28.

The drain of the transistor 29 is coupled to the source of the transistor 24. The source of the transistor 29 is coupled to a bit line BL. A control signal BLS is input to the gate of the transistor 29.

The latch circuit SDL includes, for example, inverters 30 and 31 and N-type MOS transistors 32 and 33. The input node of the inverter 30 is coupled to the node SLAT, and the output node of the inverter 30 is coupled to the node SINV. The input node of the inverter 31 is coupled to the node SINV, and the output node of the inverter 31 is coupled to the node SLAT. One end of the transistor 32 is coupled to the node SINV, the other end of the transistor 32 is coupled to the bus LBUS, and a control signal STI is input to the gate of the transistor 32. One end of the transistor 33 is coupled to the node SLAT, the other end of transistor 33 is coupled to the bus LBUS, and a control signal STL is input to the gate of the transistor 33. For example, the data held at the node SLAT corresponds to the data held in the latch circuit SDL, and the data held at the node SINV corresponds to inverted data of the data held at a node LAT.

The circuit configurations of the latch circuits ADL, BDL and XDL are similar to the circuit configuration of, for example, the latch circuit SDL. For example, the latch circuit ADL holds data at a node ALAT and holds its inverted data at a node AINV. For example, a control signal ATI is input to the gate of the transistor 32 of the latch circuit ADL, and a control signal ATL is input to the gate of the transistor 33 of the latch circuit ADL. A description of the latch circuits BDL and XDL is omitted.

In the circuit configuration of the sense amplifier unit SAU described above, for example, a power supply voltage VDD is applied to the power supply line coupled to the source of the transistor 20. For example, a power supply voltage VSS is applied to the node SRC. Each of the control signals BLX, HLL, XXL, BLC, STB and BLS and clock CLK are generated, for example, by the sequencer 13.

It should be noted that the sense amplifier module 16 included in the semiconductor memory device 1 according to the first embodiment is not limited to the circuit configuration described above. For example, the number of latch circuits included in each sense amplifier unit SAU can be changed as appropriate, based on the number of pages stored in one cell unit CU. The logic circuit LC in the sense amplifier unit SAU may be omitted if the logic operations can be executed only by the latch circuits in the sense amplifier unit SAU.

[1-1-3] Structure of Semiconductor Memory Device 1

Hereinafter, an example of the structure of the semiconductor memory device 1 in the embodiment will be described. In the drawings referred to in the following descriptions, an X direction corresponds to the extending direction of word lines WL, a Y direction corresponds to the extending direction of bit lines BL, and a Z direction corresponds to a direction perpendicular to the surface of the semiconductor substrate used as a semiconductor layer on which the semiconductor memory device 1 is formed. For viewability purposes, hatching is appropriately added to the plan views. The hatching added to the plan views is not necessarily associated with the materials or characteristics of the structural elements to which the hatching is added. In the present specification, for viewability purposes, illustrations of structural elements, such as interconnects and contacts, are omitted as appropriate.

(Planar layout of Memory Cell Array 10)

FIG. 6 illustrates an example of a planar layout of a memory cell array 10 included in the semiconductor memory device 1 according to the first embodiment, by extracting an area corresponding to one string unit SU. As illustrated in FIG. 6, the memory cell array 10 includes a plurality of slits SLT, a plurality of memory pillars MP, a plurality of bit lines BL, and a plurality of contacts CP.

The plurality of slits SLT have portions each extending in the X direction and are arranged in the Y direction. The slits SLT split neighboring conductive layers via each slit SLT. Specifically, the slits SLT split a plurality of interconnect layers respectively corresponding to, for example, word lines WL0 to WL7 and select gate lines SGD and SGS. Also, each slit SLT includes, for example, a contact LI and a spacer SP.

Inside each slit SLT, at least a part of the contact LI is provided extending in the X direction. The spacer SP is provided on a side surface of the contact LI. A space between the contact LI and the plurality of interconnect layers adjacent to the slit SLT is insulated with the spacer SP. The contact LI is used as a part of a source line SL. The contact LI may be a semiconductor or a metal. As the spacer SP, an insulator, such as a silicon oxide ($SiO_2$) and a silicon nitride (SiN), is used.

Each memory pillar MP functions, for example, as a single NAND string NS. The plurality of memory pillars MP are arranged in a four-row stagger pattern, for example, in a space between two adjacent slits SLT. The number and the arrangement of the memory pillars MP between two adjacent slits SLT are not limited thereto and may be suitably changed.

At least a part of each of the plurality of bit lines BL extends in the Y direction, and the parts are arranged in the X direction. Each bit line BL is arranged so as to overlap at least one memory pillar MP for each string unit SU. In this example, in each memory pillar MP, two bit lines BL are arranged so as to overlap said each memory pillar MP.

A contact CP is provided between a memory pillar MP and one bit line BL out of the plurality of bit lines BL overlapping said memory pillar MP. Each memory pillar MP is electrically coupled to a corresponding bit line BL via a contact CP. One contact CP is coupled to one bit line BL, for example, in respective spaces partitioned by the slits SLT.

As described above, in the semiconductor memory device 1 according to the first embodiment, respective spaces partitioned by the slits SLT correspond to one string unit SU. In the memory cell array 10, for example, the layout illustrated in FIG. 6 is arranged repeatedly in the Y direction. It should be noted that the slits SLT may be provided at minimum in a boundary portion of neighboring blocks BLK. When a plurality of string units SU are arranged between neighboring slits SLT, a select gate line SGD between the neighboring slits SLT is separated by, for example, a slit different than the slits SLT.

(Cross-Sectional Structure of Memory Cell Array 10)

Figure 7:
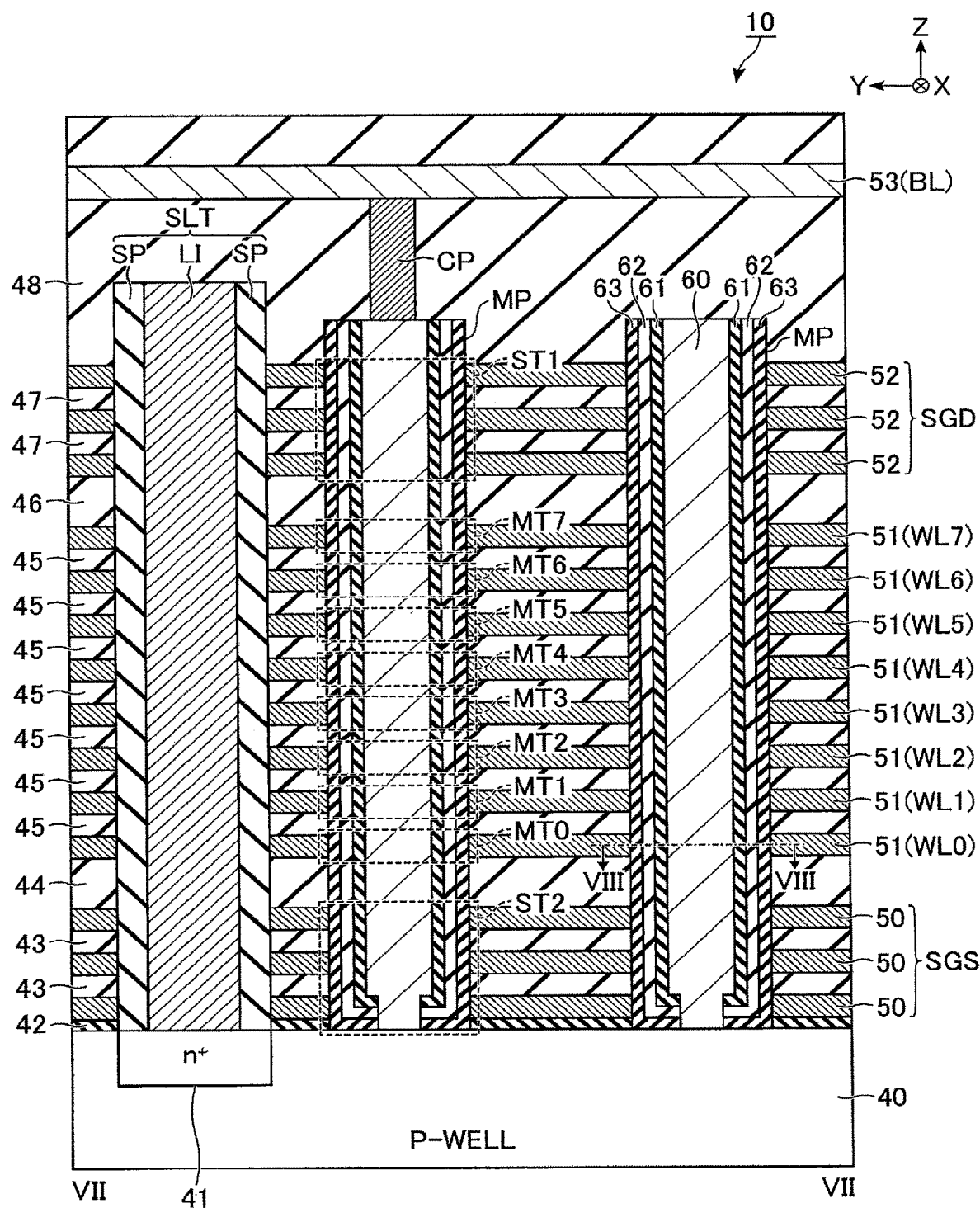
FIG. 7 is a cross-sectional view along the VII-VII line in FIG. 6, illustrating an example of a cross-sectional structure of the memory cell array included in the semiconductor memory device according to the first embodiment.

FIG. 7 is a cross-sectional view along the VII-VII line in FIG. 6 and illustrates an example of a cross-sectional structure of the memory cell array 10 included in the semiconductor memory device 1 according to the first embodiment. As illustrated in FIG. 6, the memory cell array 10 includes a P-WELL area 40, insulating layers 42 to 48, and conductive layers 50 to 53.

The P-WELL area 40 is provided in the vicinity of the surface of the semiconductor substrate and includes an N-type semiconductor region 41. The N-type semiconductor region 41 is an N-type impurity diffusion region provided in the vicinity of the surface of the P-WELL area 40. The N-type semiconductor region 41 is doped with, for example, phosphorus (P).

An insulating layer 42 is provided above the P-WELL area 40. A conductive layer 50 and an insulating layer 43 are alternately stacked on the insulating layer 42. The conductive layer 50 is formed, for example, in a plate shape extending along an X-Y plane. The plurality of stacked conductive layers 50 are used as the select gate line SGS. The conductive layers 50 contain, for example, tungsten (W).

An insulating layer 44 is provided above the uppermost conductive layer 50. A conductive layer 51 and an insulating layer 45 are alternately stacked on the insulating layer 44. The conductive layer 51 is formed, for example, in a plate shape extending along the X-Y plane. The stacked plurality of conductive layers 51 are used as word lines in the order of WL0 to WL7, respectively, from the side of the P-WELL area 40. The conductive layers 51 contain, for example, tungsten (W).

An insulating layer 46 is provided above the uppermost conductive layer 51. A conductive layer 52 and an insulating layer 47 are alternately stacked on the insulating layer 46. The conductive layer 52 is formed, for example, in a plate shape extending along the X-Y plane. The stacked plurality of conductive layers 52 are used as a select gate line SGD. The conductive layers 52 contain, for example, tungsten (W).

An insulating layer 48 is provided above the uppermost conductive layer 52. A conductive layer 53 is provided above the insulating layer 48. The conductive layer 53 is formed, for example, in a line shape extending in the Y direction and is used as a bit line BL. That is, a plurality of the conductive layers 53 are arranged along the X direction in an area not shown. The conductive layers 53 include, for example, copper (Cu).

Each memory pillar MP is provided extending along the Z direction and penetrates through the insulating layers 42 to 47 and the conductive layers 50 to 52. The bottom of each memory pillar MP is in contact with the P-WELL area 40. Each memory pillar MP includes, for example, a semiconductor layer 60, a tunnel insulating film 61, an insulating film 62, and a block insulating film 63.

A semiconductor layer 60 is provided extending along the Z direction. For example, the upper end of the semiconductor layer 60 is included in a layer higher than the uppermost conductive layer 52, and the lower end of the semiconductor layer 60 is in contact with the P-WELL area 40. The tunnel insulating film 61 covers a side surface of the semiconductor layer 60. The insulating film 62 covers a side surface of the tunnel insulating film 61. The block insulating film 63 covers a side surface of the insulating film 62. Both the tunnel insulating film 61 and the block insulating film 63 include, for example, a silicon oxide ($SiO_2$). The insulating film 62 includes, for example, a silicon nitride (SiN).

A contact CP is provided in a columnar shape on the semiconductor layer 60 within the memory pillar MP. The contact CP corresponding to one memory pillar MP out of two memory pillars MP is illustrated in the area. The contact CP is coupled, in an area (not shown), to the memory pillar MP in said area to which no contact CP is coupled.

A single conductive layer 53, i.e., one bit line BL, is provided on the contact CP. As described above, a single contact CP is coupled to a single conductive layer 53 (one bit line BL) in respective spaces partitioned by slits SLT. That is, one memory pillar MP is electrically coupled to each of the conductive layers 53 for each area between two adjacent slits SLT.

The slit SLT is formed, for example, to have a shape extending along the X-Z plane and divides the insulating layers 42 to 47 and the conductive layers 50 to 52. The upper end of the slit SLT is included in a layer between the uppermost conductive layer 52 and the conductive layer 53. The lower end of the slit SLT is in contact with the N-type semiconductor region 41 within the P-WELL area 40. Specifically, the contact LI in the slit SLT is formed to have a plate shape extending in the X-Z plane. The bottom of the contact LI is electrically coupled to the N-type semiconductor region 41. A spacer SP in the slit SLT covers a side surface of the contact LI. The contact LI is isolated from each of the conductive layers 50 to 52 by spacers SP and is insulated with the spacers SP.

Figure 8:
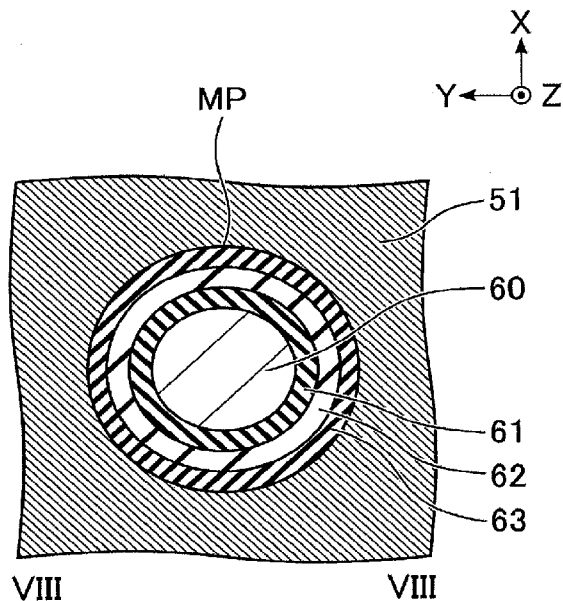
FIG. 8 is a cross-sectional view along the VIII-VIII line in FIG. 7, illustrating an example of a cross-sectional structure of a memory pillar in the semiconductor according to the first embodiment.

FIG. 8 is a cross-sectional view along the VIII-VIII line in FIG. 7 and illustrates an example of a cross-sectional structure of the memory pillar MP in the semiconductor memory device 1 according to the first embodiment, by extracting a cross-section of the memory pillar MP in a layer parallel to the surface of the semiconductor substrate and including the conductive layer 51. As illustrated in FIG. 8, in the layer including the conductive layer 51, the semiconductor layer 60 is provided at a central portion of the memory pillar MP, for example. The tunnel insulating film 61 surrounds the side surface of the semiconductor layer 60. The insulating film 62 surrounds the side surface of the tunnel insulating film 61. The block insulating film 63 surrounds the side surface of the insulating film 62. The conductive layer 51 surrounds the side surface of the block insulating film 63.

In the above-described structure of the memory pillar MP, a portion where the memory pillar MP intersects with the conductive layer 50 functions as a select transistor ST2. A portion where the memory pillar MP intersects with the conductive layer 51 functions as a memory cell transistor MT. A portion where the memory pillar MP intersects with the conductive layer 52 functions as a select transistor ST1. That is, the semiconductor layer 60 functions as each channel for the memory cell transistors MT0 to MT7 and the select transistors ST1 and ST2. The insulating film 62 functions as a charge storage layer of each memory cell transistor MT.

[1-1-4] Data Storage Method

Figure 9:
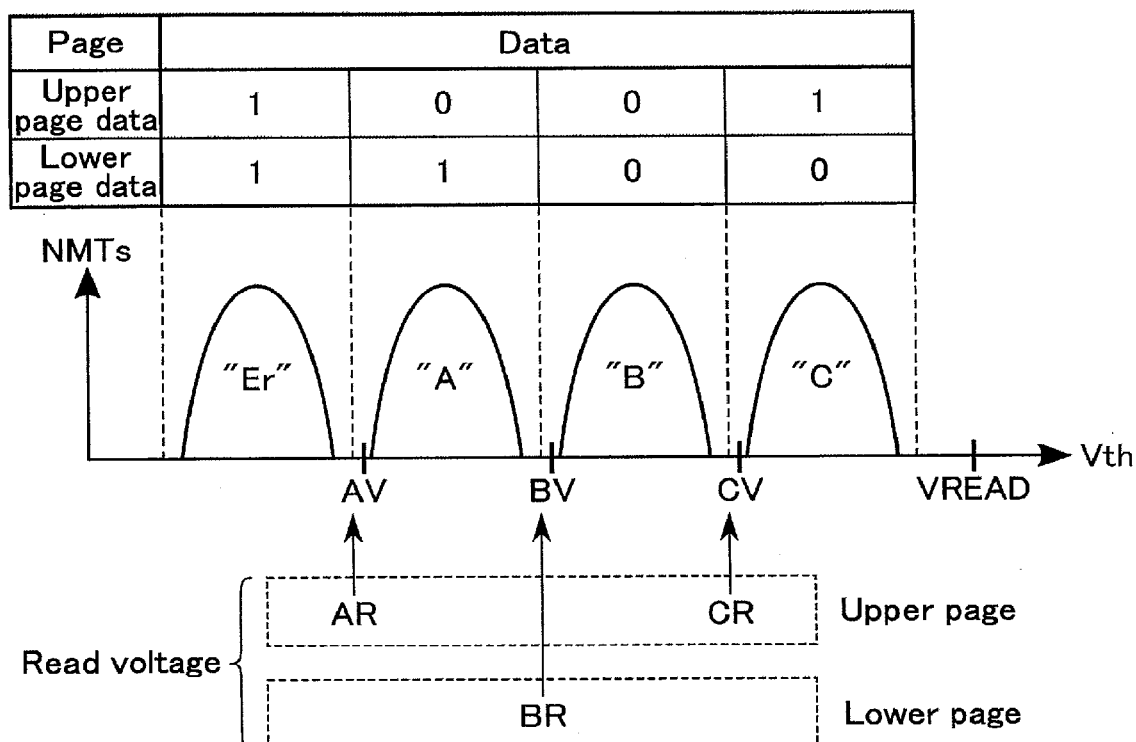
FIG. 9 is a diagram illustrating an example of data allocations used in a memory transistor in the semiconductor memory device according to the first embodiment.

FIG. 9 illustrates an example of how the threshold distributions, read voltages, and verify voltages of memory cell transistors MT are in the semiconductor memory device 1 according to the first embodiment. It should be noted that in the threshold distribution diagram referred to below, NMTs on the vertical axis represents the number of memory cell transistors MT, and Vth on the horizontal axis represents threshold voltages of the memory cell transistors MT.

As illustrated in FIG. 9, in the semiconductor memory device 1 according to the first embodiment, for example, four types of threshold distributions are formed by a plurality of memory cell transistors MT. These four types of threshold distributions are referred to, for example, as "Er" state, "A" state, "B" state and "C" state in ascending order of threshold voltage. The "Er" state corresponds to the erased state of a memory cell transistor MT. Each of the "A" state, "B" state and "C" state corresponds to a state in which data is written in a memory cell transistor MT.

Different 2-bit data are allocated to each of the "Er" state, "A" state and "C" state, and are set such that only 1-bit data changes between two adjacent states. The method of storing 2-bit data in one memory cell transistor is called a multi-level cell (MLC) method. An example of data allocation to the four types of threshold distribution is as follows:

"Er" state: "111 (upper bit/lower bit)" data
"A" state: "01" data
"B" state: "00" data
"C" state: "10" data A verify voltage used in a write operation is set between the adjacent states. Specifically, a verify voltage AV is set between the "Er" state and the "A" state, a verify voltage BV is set between the "A" state and the "B" state, and a verify voltage CV is set between the "B" state and the "C" state.

The verify voltages AV, BV and CV are respectively used in a program in the "A" state, "B" state, or "C" state. In a write operation, the semiconductor memory device 1 detects that the threshold voltage of a memory cell transistor MT for storing certain data exceeds the verify voltage corresponding to the data, and, upon detection, completes the program for the memory cell transistor MT.

A read voltage used in a read operation is set between the adjacent states. Specifically, a read voltage AR is set between the "Er" state and the "A" state, a read voltage BR is set between the "A" state and the "B" state, and a read voltage CR is set between the "B" state and the "C" state. A read pass voltage VREAD is set to a voltage higher than the "C" state.

The read voltages AR, BR and CR are respectively used for distinction between the "Er" state and the "A" state or higher, distinction between the "A" state or lower and the "B" state or higher, and distinction between the "B" state or lower and the "C" state or higher. The memory cell transistor MT having the gate to which the read pass voltage VREAD is applied enters the ON state without reference to the data it stores. In the read operation, the semiconductor memory device 1 determines read data by determining a state in which the memory cell transistors MT are distributed using the read voltage.

For example, where the data allocation illustrated in FIG. 9 is applied, one page data consisting of lower bits (lower page data) is determined by a read operation using the read voltage BR. One page data consisting of upper bits (upper page data) is determined by read operations respectively using read voltages AR and CR. In a page read operation using a plurality of read voltages, the logic circuit LC appropriately performs arithmetic processing.

It should be noted that the aforementioned number of bits of data stored in one memory cell transistor MT is an example and is not limited thereto. For example, data of 1 bit or data of 3 bits or more may be stored in the memory cell transistor MT. In the semiconductor memory device 1, the number of threshold distributions formed, the read voltages, the read pass voltage, the verify voltages, etc. can be appropriately set in accordance with the number of bits stored in the memory cell transistor MT.

[1-2] Operation of Semiconductor Memory Device 1

Next, a description will be given of an operation performed by the semiconductor memory device according to the first embodiment. The semiconductor memory device 1 according to the first embodiment sequentially executes write operations from the memory cell transistors MT provided on the side of the select transistor ST2 within the NAND string NS. In other words, the semiconductor memory device 1 according to the first embodiment executes a write operation from cell units CU on the source line SL side in sequence.

In the description below, a selected word line will be referred to as WLsel, and a non-selected word line will be referred to as WLusel. A select gate line associated with a selected cell unit CU will be referred to as SGDsel, and a select gate line associated with a non-selected cell unit CU will be referred to as SGDusel. The application of a voltage to a bit line BL corresponds to the operation in which the sense amplifier unit SAU applies a voltage to the bit line BL. The application of a voltage to an interconnect, such as a word line WL and a select gate line SGD, corresponds to the operation in which the driver module 14 applies the voltage to the related interconnect via a signal line and the row decoder module 15. It is assumed that a command CMD and address information ADD received by the semiconductor memory device 1 are transferred to the command register 11 and the address register 12, respectively.

[1-2-1] Outline of Write Operation

FIG. 10 illustrates an example of a command sequence and a timing chart of the write operation performed by the semiconductor memory device 1 according to the first embodiment, and indicates a voltage applied to a word line WLsel. As illustrated in FIG. 10, in the state before the write operation, a ready/busy signal RBn is at the "H" level, and the voltage of the word line WLsel is VSS.

First, the memory controller 2 transmits command sets CS1 and CS2 in sequence to the semiconductor memory device 1. Each of the command sets CS1 and CS2 includes, for example, a command for instructing a write operation and address information, and command sets CS1 and CS2 include write data for a lower page and an upper page, respectively.

Upon reception of the command set CS1, the semiconductor memory device 1 temporarily transitions from the ready state to the busy state. Then, the sequencer 13 transfers the write data of the lower page held in each latch circuit XDL to, for example, the latch circuit ADL that shares the bus LBUS in the sense amplifier unit SAU.

Upon reception of the command set CS2, the semiconductor memory device 1 transitions from the ready state to the busy state. Then, the sequencer 13 starts a write operation based on the command CMD held in the command register 11, the address information held in the address register 12, and the write data held in the sense amplifier module 16. In the write operation, the sequencer 13 repeatedly executes a program loop. The program loop includes, for example, a program operation and a verify operation.

The program operation is an operation for increasing the threshold voltage of the memory cell transistor MT. In the program operation, the memory cell transistor MT of selected cell unit CU is set based on write data held in the sense amplifier unit SAU such that the memory cell transistor MT is a program target or is a program inhibit. Specifically, the memory cell transistor MT that has not reached the threshold voltage of the state corresponding to the write data held in the sense amplifier unit SAU is set as a program target, and the memory cell transistor MT that has reached the threshold voltage is set as a program inhibit. In the description below, a state corresponding to write data in the sense amplifier unit SAU will be referred to as a write state. A bit line coupled to the program target memory cell transistor MT will be referred to as BLprog, and a bit line coupled to the program-inhibited memory cell transistor MT will be referred to as BLinh.

In the program operation, a program voltage VPGM is applied to the word line WLsel. The program voltage VPGM is a voltage that is high enough to increase the threshold voltage of the memory cell transistor MT. When program voltage VPGM is applied to the word line WLsel, the threshold voltage of the memory cell transistor MT that is coupled to the word line WLsel and coupled to the program target bit line BL increases. On the other hand, an increase in the threshold voltage of the memory cell transistor MT that is coupled to the word line WLsel and coupled to the program-inhibited bit line BL is suppressed by, for example, a self-boost technique. When the program operation ends, the sequencer 13 proceeds to the verify operation.

The verify operation is a read operation for determining whether or not the memory cell transistor MT in a selected cell unit CU has reached the threshold voltage of the write state. In the verify operation, a verify voltage used for determination of the threshold voltage is determined for each sense amplifier unit SAU. For example, in the verify read of the first program loop, a read operation using the verify voltage AV is executed.

The memory cell transistor MT that is confirmed to have reached the threshold voltage of the write state by the verify read is determined to have passed the verify operation. Each sense amplifier unit SAU holds the verify result of the write state in one of the internal latch circuits. Then, the sequencer 13 refers to the determination result of each sense amplifier unit SAU, counts the number of memory cell transistors MT for which write has been completed for each write state, and determines whether or not the write for the state has been completed.

The set of a program operation and a verify operation described above corresponds to one program loop. The program voltage VPGM is stepped up every time the program loop is repeated. That is, a program voltage VPGM applied to a word line WLsel increases in accordance with the number of times the program loop is executed. The step-up amount DVPGM of the program voltage VPGM can be set to any value.

If, in the repetition of the program loop, the sequencer 13 detects that the number of memory cell transistors MT that have not passed the verify, for example, in the "A" state, "B" state, or "C" state, falls below a predetermined number, the sequencer 13 ends the write operation and transitions the semiconductor memory device 1 from the busy state to the ready state. When the write operation ends, 2-page data is written to the selected cell unit CU. The "tProg" shown in FIG. 10 indicates the time during which the write operation is executed.

[1-2-2] Details of Program Loop

Figure 11:
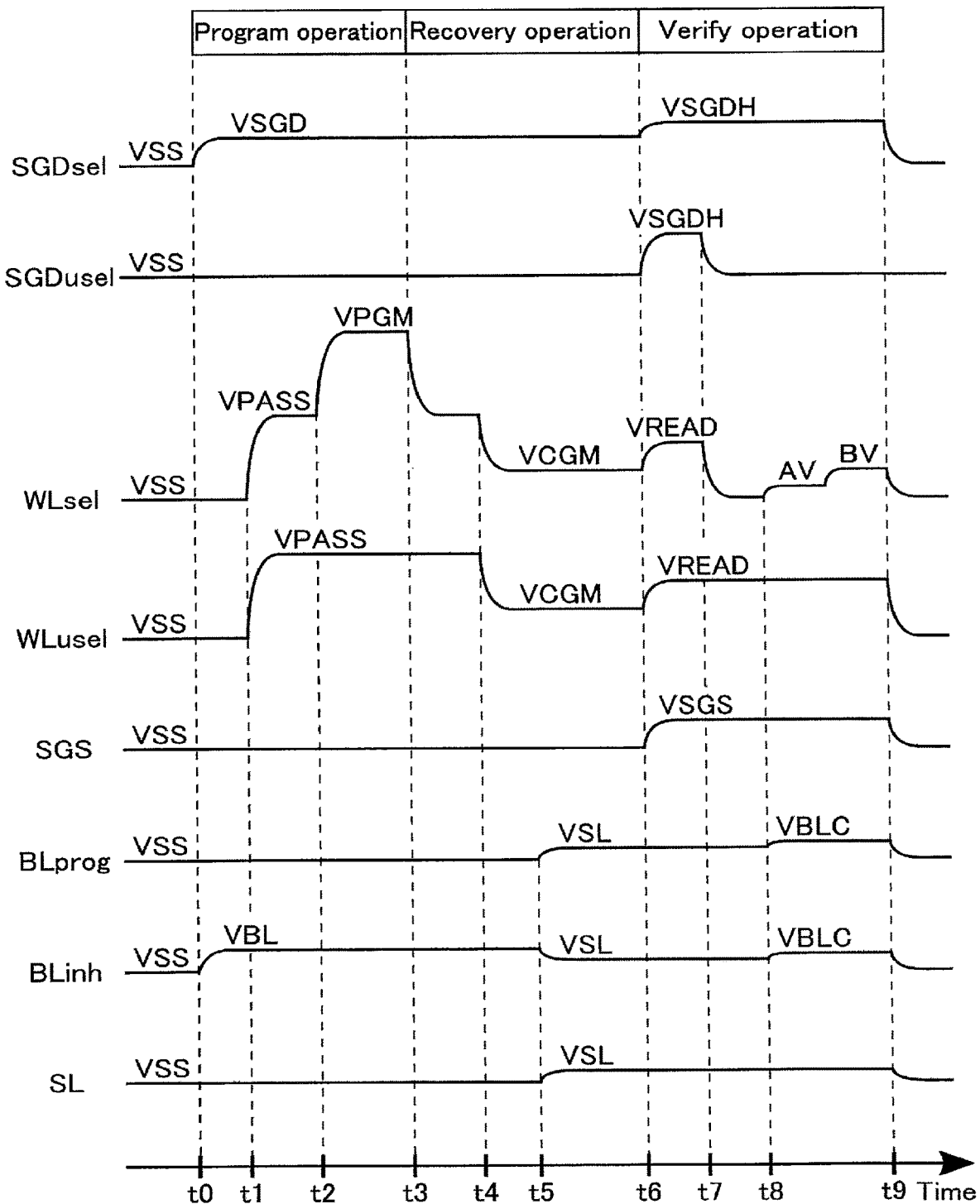
FIG. 11 is a timing chart illustrating an example of a program loop in the semiconductor memory device according to the first embodiment.

FIG. 11 illustrates an example of a timing chart of a program loop in a write operation of the semiconductor memory device 1 according to the first embodiment. Specifically, FIG. 11 shows an example of changes in respective voltages of the select gate lines SGDsel and SGDusel, the word lines WLsel and WLusel, the select gate line SGS, the bit lines BLprog and BLinh, and the source line SL, in a program loop. It is assumed that the respective voltages of the select gate lines SGD and SGS, word line WL, bit line BL, and source line SL before the processing of the program loop are VSS (e.g., 0V).

As illustrated in FIG. 11, in the program loop, the sequencer 13 executes the processing of t0 to t9 in sequence. For example, a period from time t0 to time t3 corresponds to a program operation, a period from time t3 to time t6 corresponds to a recovery operation, and a period from time t6 to time t9 corresponds to a verify operation. The recovery operation is an operation in which an end operation of the program operation and the ready operation of the verify operation are combined. Hereinafter, each of the program operation, recovery operation, and verify operation will be described in the order mentioned with reference to FIG. 11.

(Program Operation)

At time to, a voltage VSGD is applied to a select gate line SGDsel, and a voltage VBL is applied to a program-inhibited bit line BLinh. VSGD is a higher voltage than VSS and is, for example, 4V. VBL is a higher voltage than VSS and is, for example, 2V. At this time, the select transistor ST1 that is coupled to the program target bit line BLprog and that has the gate to which the VSGD is applied enters the ON state. On the other hand, the select transistor ST1 that is coupled to the program-inhibited bit line BLinh and that has the gate to which VSGD is applied and the select transistor ST1 having the gate to which VSS is applied enter the OFF state. The select transistor ST2 is in the OFF state because VSS is applied to the gate of the select transistor ST2. Therefore, the channel of the NAND string NS including the select transistors ST1 and ST2 in the OFF state enters a floating state.

At time t1, a voltage VPASS is applied to each of the word lines WLsel and WLusel. VPASS is a higher voltage than VSGD and is, for example, 10V. Upon application of the voltage VPASS to each of the word lines WLsel and WLusel, the channel voltage of the NAND string, which is in the floating state, increases (self-boost) due to the coupling between the channel and the control gate. On the other hand, an increase in channel voltage of the NAND string NS, in which the select transistor ST1 is in the OFF state, is suppressed by a voltage (e.g., VSS) applied to the program target bit line BLprog.

At time t2, a program voltage VPGM is applied to a word line WLsel. The program voltage VPGM is, for example, 20V. When VPGM is applied to the word line WLsel, electrons are injected into the charge storage layer of the memory cell transistor coupled to the select transistor ST1 which is coupled to the program target bit line BLprog and that has the gate to which VSGD is applied, based on the difference in voltage between the channel and the control gate. Then, the threshold voltage of the memory cell transistor MT increases based on the fact that electrons have been injected into the charge storage layer. On the other hand, an increase in threshold voltage of the memory cell transistor MP within other NAND strings NS is suppressed because the difference in voltage between the channel and the control gate has been reduced by the self-boost.

(Recovery Operation)

At time t3, VPASS is applied to the word line WLsel, and the voltage of the word line WLsel drops. In the program operation, the increased amount of the threshold voltage of the program target memory cell transistor MT is based on the voltage value of VPGM and the time during which VPGM is applied to the word line WLsel.

At time t4, a voltage VCGM is applied to each of the word lines WLsel and WLusel. The voltage VCGM is a voltage higher than VSS and lower than VPASS and is, for example, 3 to 5V. When VCGM is applied to the word lines WLsel and WLusel, the channel voltage of the NAND string NS, which is in the floating state, drops due to the coupling between the channel and the control gate.

At time t5, a voltage VSL is applied to each of the bit lines BLprog and BLinh and the source line SL. VSL is a voltage higher than VSS and lower than VBL and is, for example, 1V. At this time, in the NAND string NS coupled to the bit line BLprog, the select transistor ST1 is placed in the ON state, and the select transistor ST2 is placed in the OFF state.

Since the semiconductor memory device 1 according to the first embodiment executes a write operation from the source line SL side, the threshold voltage of a memory cell transistor MT between the program target memory cell transistor MT and the select transistor ST1 is included in the "Er" state. Therefore, the memory cell transistor MT between the program target memory cell transistor MT and the select transistor ST1 is placed in the ON state by having VCGM applied to it. As a result, electrons remaining inside the channel of the NAND string NS coupled to the bit line BLprog are pulled out to the bit lines BL, based on the fact that VSL has been applied to the program target bit line BLprog.

(Verify Operation)

At time t6, a voltage VSGDH is applied to each of the select gate lines SGDsel and SGDusel, a voltage VREAD is applied to each of the word lines WLsel and WLusel, and a voltage VSGS is applied to the select gate line SGS. VSGDH is a higher voltage than VSGD and is, for example, 6V. VREAD is a higher voltage than VCGM and is, for example, 8V. VSGS is a voltage higher than VSS and is, for example, 6V. By the processing at time t6, the select transistors ST1 and ST2 and memory cell transistor MT within the selected block BLK enter the ON state, and the state of the channel of each NAND string NS becomes uniform.

At time t7, VSS is applied to each of the select gate line SGDusel and the word line WLsel. When VSS is applied to the select gate line SGDusel, the select transistor ST1 within a non-selected string unit SU enters the OFF state. That is, a current path via the non-selected string unit SU is interrupted between each bit line BL and each source line SL.

At time t8, for example, verify voltages AV and BV are applied in the order mentioned to the word line WLsel, and a voltage VBLC is applied to the bit line BL. VBLC is a voltage higher than VSL and lower than VBL and is, for example, 1.5V. When the verify voltage is applied to the word line WLsel, the memory cell transistor MT coupled to said word line WLsel enters the ON state or OFF state, based on the data (threshold voltage) it holds. Then, the voltage of the bit line BL changes based on whether the memory cell transistor MT is in the OFF state or ON state. Thereafter, the sequencer 13 asserts a control signal sTB during which each verify voltage (e.g., verify voltages AV and BV) is applied to the word line WLsel to hold the read result in latch circuits within the sense amplifier unit SAU.

At time t9, VSS is applied to each of the select gate line SGDsel, the word lines WLsel and WLusel, the select gate line SGDsel, the bit lines BLprog and BLinh, and the source line SL. This allows the voltage of each interconnect to return to the state before the start of the program loop.

As described above, in the semiconductor memory device 1 according to the first embodiment, the sequencer 13 executes the program loop including the program operation, recovery operation and verify operation. It suffices that the recovery operation in the first embodiment has a period in which at minimum VSGD is applied to the select gate line SGDsel and VSL is applied to the bit line BLprog. The type and the number of verify voltages used in the verify operation can vary based on the write data and the progress status of the program loop.

[1-3] Advantageous Effects of First Embodiment

According to the semiconductor memory device 1 of the first embodiment as described above, it is possible to reduce the occurrence of error bits and enhance the reliability of data written in memory cell transistors MT. In the description below, the details of advantageous effects of the semiconductor memory device 1 according to the first embodiment will be described.

In a semiconductor memory device, the threshold voltage of a memory cell may vary immediately after a program operation. For example, in a charge trap memory cell, some of the electrons injected into the charge storage layer by a write operation can be released to the channel after the write operation. The decrease in the threshold voltage that occurs after the write operation is referred to as data retention. In the description below, a phenomenon in which electrons within the charge storage layer of a memory cell transistor MT are released to the channel by the data retention will be referred to as "detrapping".

FIG. 12 illustrates an example of a change in threshold distribution of a memory cell transistor MT in a program loop in the write operation of the semiconductor memory device. FIG. 12 (1) illustrates a threshold distribution immediately after performing a program operation, and FIG. 12 (2) illustrates a threshold distribution during a verify operation. As illustrated in FIG. 12, the data retention can also occur in a period during which the program operation proceeds to the verify operation, i.e., during a period of a recovery operation. For this reason, verify voltages for respective states used in write operations are set in consideration of data retention that can occur during a period of a recovery operation.

However, there are cases where the magnitude of a decrease in threshold voltage during a period of a recovery operation varies in accordance with the threshold voltage of a program target memory cell transistor MT and the threshold voltage of a written memory cell transistor MT. For example, as the threshold voltage of the memory cell transistor MT becomes higher, the number of electrons trapped in the channel of a NAND string NS increases. Then, the electrons trapped in the channel of the NAND string NS prevent the electrons within the charge storage layer from being detrapped. In other words, the electrons trapped in the channel of the NAND string NS can suppress a decrease in threshold voltage in a program target memory cell transistor MT during the period of a recovery operation.

It is considered that as the number of electrons trapped in the channel of the NAND string NS increases, the influence of suppressing the detrapping of electrons in a program target memory cell transistor MT becomes greater. The threshold voltage of a memory cell transistor MT that has passed verification in a state where detrapping of electrons is suppressed in this way is liable to have a greater than usual decrease by the data retention occurring subsequent to the verification. As a result, the lower skirt of the threshold distribution of each state broadens, resulting in an increased number of error bits during a read operation.

As countermeasures to the problem, pulling out electrons remaining inside the NAND string NS to the bit line BL side by bringing the select transistor ST1 to the ON state during a recovery operation is considered. On the other hand, when the select transistor ST1 is brought to the ON state during a recovery operation, concentration of electric fields is likely to occur in the select transistor ST1. In this case, the electrons remaining inside the NAND string NS may turn into hot carriers and be injected into the select transistor ST1. Injection of hot carriers to the select transistor ST1 may cause deterioration of the physical properties of the select transistor ST1.

Figure 13:
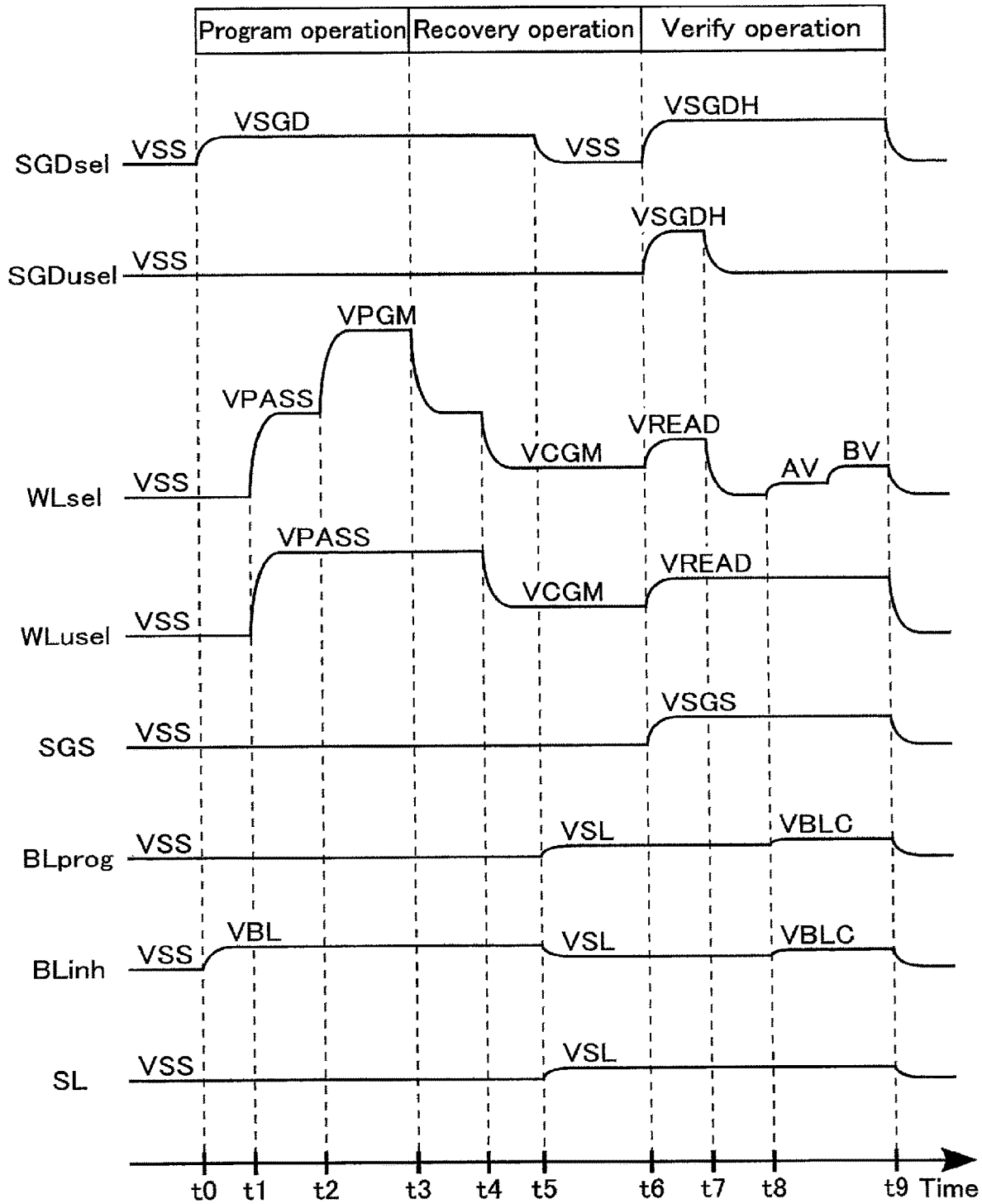
FIG. 13 is a timing chart illustrating an example of a program loop in a semiconductor memory device according to a comparative example of the first embodiment.

FIG. 13 illustrates an example of a timing chart of a program loop in a write operation of the semiconductor memory device 1 according to the first embodiment. As illustrated in FIG. 13, the program loop in a comparative example of the first embodiment differs from the program loop in the first embodiment illustrated in FIG. 11 in the operation of the select gate line SGDsel in the period between time t5 and time t6. Specifically, in the comparative example of the first embodiment, VSS is applied to the select gate line SGDsel in the period between time t5 and time t6 included in the recovery operation.

That is, the semiconductor memory device according to the comparative example of the first embodiment controls the select transistors ST1 in each block BLK to be in the OFF state during a recovery operation. With this control, it is possible for the semiconductor memory device 1 according to the comparative example of the first embodiment to prevent electrons remaining inside the NAND string NS from turning into hot carriers and from being injected into the select transistor ST1. In a write operation at the comparative example of the first embodiment, variation in data retention occurring in the program loop increases as described above, and the lower skirt of the threshold distribution of the memory cell transistor MT is able to broaden.

Therefore, the semiconductor memory device 1 according to the first embodiment includes a select gate line SGD composed of a plurality of conductive layers 52 and causes intersecting portions between each of the plurality of conductive layer 52 and a memory pillar MP to function as a select transistor ST1. That is, the semiconductor memory device 1 in the first embodiment uses a plurality of select transistors ST1 coupled in series in each NAND string NS as a single select transistor ST1.

Then, the semiconductor memory device 1 according to the first embodiment controls the select transistors ST1 within the selected string unit SU to be in the ON state during a recovery operation. With this control, in the semiconductor memory device 1 according to the first embodiment, electrons remaining inside a NAND string NS are pulled out to the bit line BL side during a recovery operation. At that time, in the select gate line SGD, concentration of electric fields is moderated because the select gate line SGD is provided with the plurality of conductive layers 52.

As a result, the semiconductor memory device according to the first embodiment can shorten the width of a threshold distribution and reduce performance degradation of the select transistor ST1 by stably generating data retention in a recovery operation. Therefore, the semiconductor memory device 1 according to the first embodiment can reduce the occurrence of error bits and enhance the reliability of data written in memory cell transistors MT.

[1-4] Modification of First Embodiment

The above-mentioned recovery operation in the semiconductor memory device 1 according to the first embodiment allows various modifications. In the description below, program loops in the semiconductor memory device 1 according to the first to third modifications of the first embodiment will be described in the order mentioned.

First Modification of First Embodiment

FIG. 14 illustrates an example of a timing chart of a program loop in a semiconductor memory device 1 according to a first modification of the first embodiment. As illustrated in FIG. 14, the operation of a select gate line SGDsel at time t5 differs between the program loop in the first modification of the first embodiment and the program loop of the first embodiment.

Specifically, in the first modification of the first embodiment, VSGDH is applied to the select gate line SGDsel at time t5. That is, in the first modification of the first embodiment, the timing at which VSGDH is applied to the select gate line SGDsel is faster than the timing in the first embodiment. It suffices that the timing at which VSGDH is applied to the select gate line SGDsel in the first modification of the first embodiment is at minimum during a recovery operation. The other operations of the semiconductor memory device 1 according to the first modification of the first embodiment are similar to those of the first embodiment.

In this way, in the first modification of the first embodiment, the sequencer 13 executes the control of the select gate line SGDsel necessary for a verify operation during a recovery operation. As a result, the semiconductor memory device 1 according to the first modification of the first embodiment can obtain similar advantageous effects to those of the first embodiment and can further shorten the time required for a verify operation.

Second Modification of First Embodiment

Figure 15:
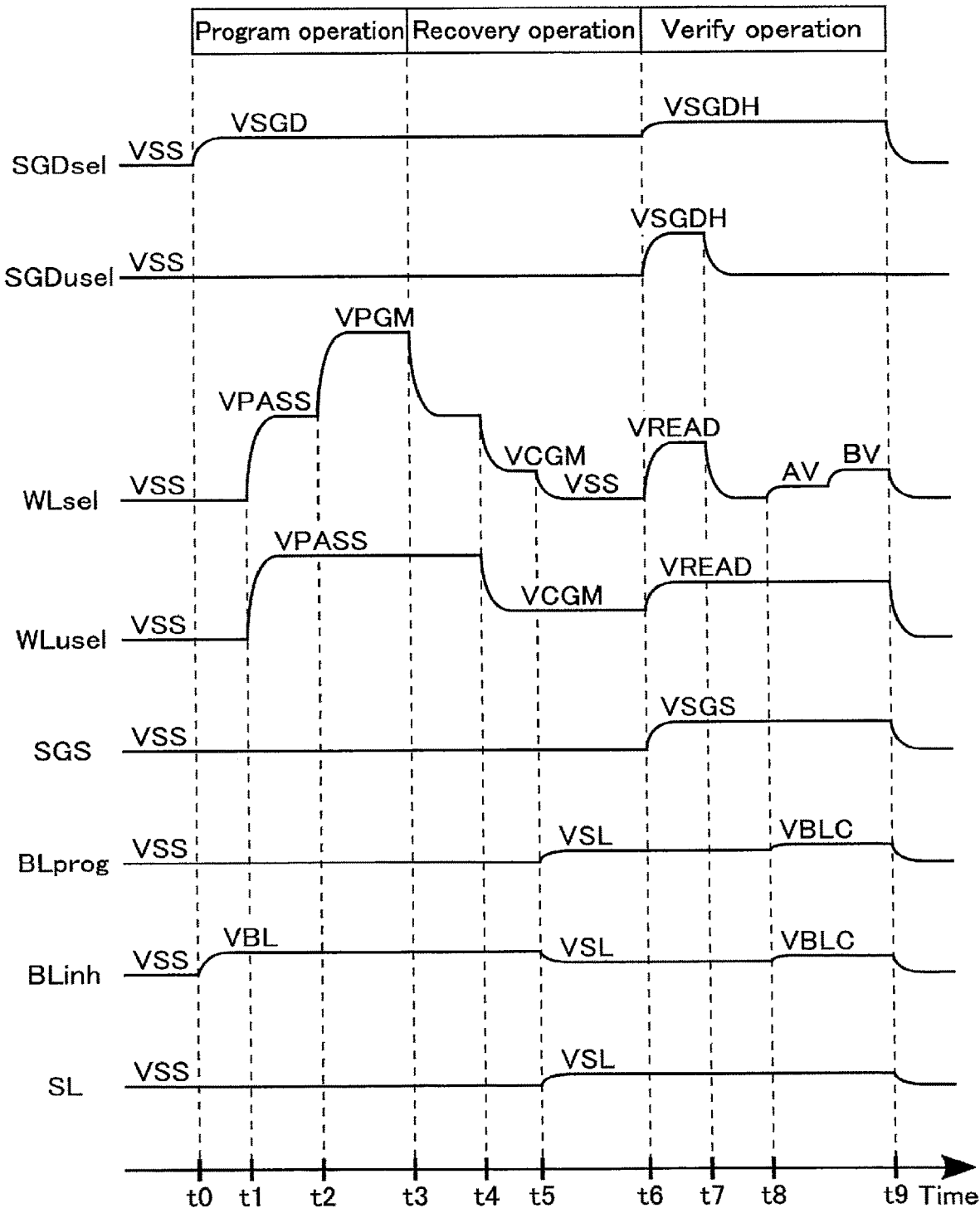
FIG. 15 is a timing chart illustrating an example of a program loop in a semiconductor memory device according to a second modification of the first embodiment.

FIG. 15 illustrates an example of a timing chart of a program loop in a semiconductor memory device 1 according to a second modification of the first embodiment. As illustrated in FIG. 15, the operation of a word line WLsel at time t5 differs between the program loop in the second modification of the first embodiment and the program loop of the first embodiment.

Specifically, in the second modification of the first embodiment, VSS is applied to the word line WLsel at time t5. That is, VSS is applied to the word line WLsel during the time VSGD and VSL are applied to the select gate line SGDsel and the bit line BLprog, respectively. It suffices that the timing at which VSS is applied to the word line WLsel in the second modification of the first embodiment is at minimum during a recovery operation. The other operations of the semiconductor memory device 1 according to the second modification of the first embodiment are similar to those of the first embodiment.

With this configuration, in the recovery operation in the second modification of the first embodiment, the word line WLsel has VSS applied to it, whereby electrons trapped in the channel of the memory cell transistor MT that is coupled to the word line WLsel are easily detrapped. As a result, the semiconductor memory device 1 according to the second modification of the first embodiment can generate detrapping of electrons in the program target memory cell transistor MT during the recovery operation more stably than in the first embodiment. Therefore, the semiconductor memory device 1 according to the second modification of the first embodiment can make the width of the threshold distribution shorter than in the first embodiment and can further enhance the reliability of data written in the memory cell transistor MT.

Third Modification of First Embodiment

A semiconductor memory device 1 according to a third modification of the first embodiment differs from the first embodiment in the order in which it executes a write operation. Specifically, the semiconductor memory device 1 according to the third modification of the first embodiment executes a write operation from memory cell transistors MT provided on the select transistor ST1 side in sequence within a NAND string NS. In other words, the semiconductor memory device 1 according to the third modification of the first embodiment executes a write operation from cell units CU on the bit line BL side in sequence in each block BLK.

FIG. 16 illustrates an example of a timing chart of a program loop in the semiconductor memory device 1 according to the third modification of the first embodiment. As illustrated in FIG. 16, the operation of the select gate lines SGDsel and SGS at time t5 differs between the program loop in the third modification of the first embodiment and the program loop of the first embodiment.

Specifically, in the third modification of the first embodiment, VSS is applied to the select gate line SGDsel at time t5, and VSGS is applied to the select gate line SGS. That is, in a recovery operation, the select transistors ST1 and ST2 are controlled to be in the OFF state and the ON state, respectively. It suffices that the timing at which VSS and VSGS are applied to the select gate lines SGDsel and SGS, respectively, in the third modification of the first embodiment is at minimum during a recovery operation. It should be noted that VSS is preferably applied to the select gate line SGDsel at time t5; however, VSGD may be applied thereto.

Also, in the third modification of the first embodiment, a write operation is executed from the bit line BL side, and thus the threshold voltage of the memory cell transistor MT between the program target memory cell transistor MT and the select transistor ST2 is included in the "Er" state. Therefore, the memory cell transistor MT between the program target memory cell transistor MT and the select transistor ST2 is placed in the ON state by having VCGM applied to it. The other operations of the semiconductor memory device 1 according to the third modification of the first embodiment are similar to those of the first embodiment.

In the above-described recovery operation in the third modification of the first embodiment, electrons trapped in the channel of the memory cell transistor MT coupled to the word line WLsel are pulled out to a source line SL in response to the fact that VSL has been applied to the source line SL. At that time, in the select gate line SGS, concentration of electric fields is moderated because the select gate line SGS is provided with a plurality of conductive layers 50. With this configuration, when a write operation is executed from the bit line BL side, the semiconductor memory device 1 according to the third modification of the first embodiment can shorten the width of the threshold distribution and enhance the reliability of data written in the memory cell transistors MT.

[2] Second Embodiment

The configuration of a semiconductor memory device 1 according to a second embodiment is similar to that of the first embodiment. The controlling method of the select gate line SGDsel in a write operation differs between the second embodiment and the first embodiment. A description will be given of the points in which the semiconductor memory device 1 according to the second embodiment differs from that according to the first embodiment.

[2-1] Write Operation of Semiconductor Memory Device 1

FIG. 17 illustrates an example of a timing chart of a program loop in the semiconductor memory device 1 according to the second embodiment. As illustrated in FIG. 17, the operation of the program target bit line BLprog at time t5 differs between the program loop of the second embodiment and the program loop of the first embodiment.

Specifically, in the second embodiment, VBL is applied to the bit line BLprog at time t5. That is, in the second embodiment, the voltage applied, in a recovery operation, to the bit line BLprog is higher than that in the first embodiment. Also, similarly to the first embodiment, in the NAND string NS coupled to the bit line BLprog, the select transistor ST1 is in the ON state, and the select transistor ST2 is in the OFF state.

Therefore, electrons remaining inside the channel of the NAND string NS that is coupled to the bit line BLprog are pulled out to the bit lines BL, based on the fact that VBL has been applied to the program target bit line BLprog. It suffices that the voltage applied to the bit line BLprog in the second embodiment is at minimum higher than VSL. The other operations of the semiconductor memory device 1 according to the second embodiment are similar to those of the first embodiment.

[2-2] Advantageous Effects of Second Embodiment

As described above, in the semiconductor memory device 1 according to the second embodiment, in a recovery operation, a VBL which is higher than that in the first embodiment is applied to the bit line BLprog. Therefore, in a recovery operation in the second embodiment, electrons remaining in the channel inside the NAND string NS are pulled out to the bit line BL more strongly than in the first embodiment.

With this configuration, in a recovery operation, the semiconductor memory device 1 according to the second embodiment can remove electrons remaining inside the NAND string NS in a larger amount than in the first embodiment. That is, the semiconductor memory device 1 according to the second embodiment can generate data retention more stably than in the first embodiment. That is, the semiconductor memory device 1 according to the second embodiment can reduce the occurrence of error bits and enhance the reliability of data written in the memory cell transistors MT further than the first embodiment.

[2-3] Modification of Second Embodiment

The above-mentioned recovery operation in the semiconductor memory device 1 according to the second embodiment allows various modifications. In the description below, program loops in the semiconductor memory device 1 according to the first to third modifications of the second embodiment will be described in the order mentioned.

First Modification of Second Embodiment

FIG. 18 illustrates an example of a timing chart of a program loop in the semiconductor memory device 1 according to the first modification of the second embodiment. As illustrated in FIG. 18, the operation of the select gate line SGDsel at time t5 differs between the program loop in the first modification of the second embodiment and the program loop of the second embodiment.

Specifically, in the first modification of the second embodiment, VSGDH is applied to the select gate line SGDsel at time t5. That is, in the first modification of the second embodiment, the timing at which VSGDH is applied to the select gate line SGDsel is faster than that in the second embodiment. In the first modification of the second embodiment, it suffices that the timing at which VSGDH is applied to the select gate line SGDsel is at minimum during a recovery operation. The other operations of the semiconductor memory device 1 according to the first modification of the second embodiment are similar to those of the second embodiment.

In this way, in the first modification of the second embodiment, the sequencer 13 executes the control of the select gate line SGDsel required for a verify operation during the recovery operation. As a result, the semiconductor memory device 1 according to the first modification of the second embodiment can obtain similar advantageous effects to those of the second embodiment and can further shorten the time required for a verify operation.

Second Modification of Second Embodiment

FIG. 19 illustrates an example of a timing chart of a program loop in the semiconductor memory device 1 according to the second modification of the second embodiment. As illustrated in FIG. 19, the operation of the word line WLsel at time t5 differs between the program loop in the second modification of the second embodiment and the program loop of the second embodiment.

Specifically, in the second modification of the second embodiment, VSS is applied to the word line WLsel at time t5. That is, VSS is applied to the word line WLsel during the time VSGD and VBL are applied to the select gate line SGDsel and the bit line BLprog, respectively. In the second modification of the second embodiment, it suffices that the timing at which VSS is applied to the word line WLsel is at minimum during a recovery operation. The other operations of the semiconductor memory device 1 according to the second modification of the second embodiment are similar to those of the second embodiment.

With this configuration, in the recovery operation in the second modification of the second embodiment, VSS is applied to the word line WLsel, whereby electrons trapped in the channel of the memory cell transistor MT that is coupled to the word line WLsel are easily detrapped. As a result, the semiconductor memory device 1 according to the second modification of the second embodiment can generate detrapping of electrons in the program target memory cell transistor MT during the recovery operation more stably than in the second embodiment. Therefore, the semiconductor memory device 1 according to the second modification of the second embodiment can make the width of the threshold distribution shorter than in the second embodiment and can further enhance the reliability of data written in the memory cell transistor MT.

Third Modification of Second Embodiment

A semiconductor memory device 1 according to a third modification of the second embodiment is a combination between the second embodiment and the third modification of the first embodiment. In the third modification of the second embodiment, a write operation is executed from the memory cell transistors MT provided on the select transistor ST1 side in sequence.

Figure 20:
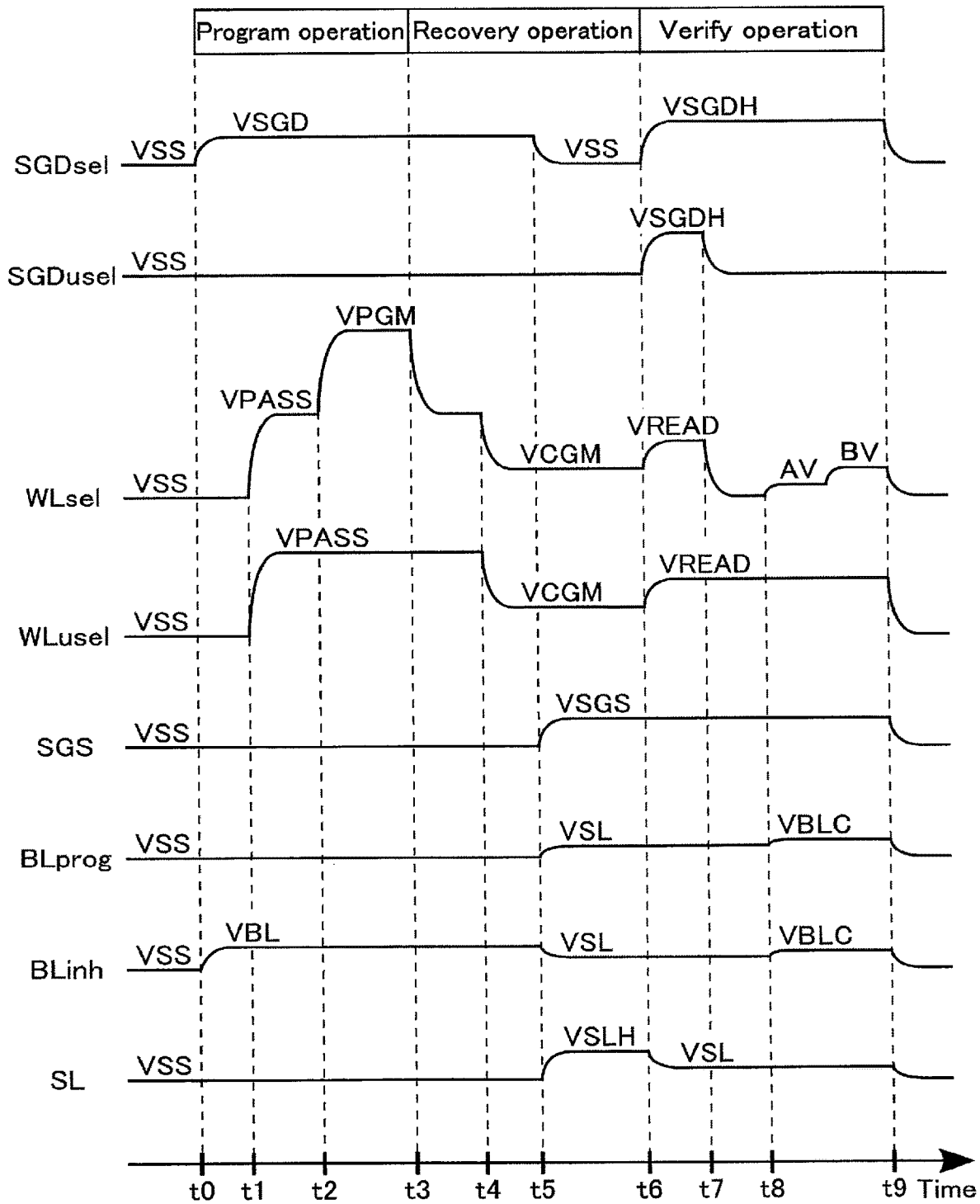
FIG. 20 is a timing chart illustrating an example of a program loop in a semiconductor memory device according to a third modification of the second embodiment.

FIG. 20 illustrates an example of a timing chart of a program loop in the semiconductor memory device 1 according to the third modification of the second embodiment. As illustrated in FIG. 20, the program loop in the third modification of the second embodiment differs from the program loop of the third modification of the first embodiment in the operation of the source line SL at time t5.

Specifically, in the third modification of the second embodiment, VSLH is applied to the source line SL at time t5. VSLH is a higher voltage than VBLC. That is, in the third modification of the second embodiment, the voltage applied to the source line SL in a recovery operation is higher than that in the third modification of the first embodiment. Similarly to the third modification of the first embodiment, in the NAND string NS coupled to the bit line BLprog, the select transistor ST1 is in the OFF state, and the select transistor ST2 is in the ON state.

Also, in the third modification of the second embodiment, a write operation is executed from the bit line BL side, and thus the threshold voltage of the memory cell transistor MT between the program target memory cell transistor MT and the select transistor ST2 is included in the "Er" state. Therefore, the memory cell transistor MT between the program target memory cell transistor MT and the select transistor ST2 is placed in the ON state by having VCGM applied to it. The other operations of the semiconductor memory device 1 according to the third modification of the second embodiment are similar to those of the third modification of the first embodiment.

In the above-described recovery operation in the third modification of the second embodiment, electrons trapped in the channel inside the NAND string NS coupled to the word line WLsel are pulled out to the bit line BL more strongly than in the third modification of the first embodiment in response to the fact that VSLH has been applied to the source line SL. With this configuration, when a write operation is executed from the bit line BL side, the semiconductor memory device 1 according to the third modification of the second embodiment can make the width of the threshold distribution shorter than in the first embodiment and further enhance the reliability of data written in the memory cell transistor MT than in the first embodiment.

[3] Third Embodiment

The configuration of a semiconductor memory device 1 according to a third embodiment is similar to that of the first embodiment. The controlling method of the select gate line SGDusel in a write operation differs between the third embodiment and the first embodiment. A description will be given of the points in which the semiconductor memory device 1 according to the third embodiment differs from those according to the first and second embodiments.

[3-1] Write Operation of Semiconductor Memory Device 1

Figure 21:
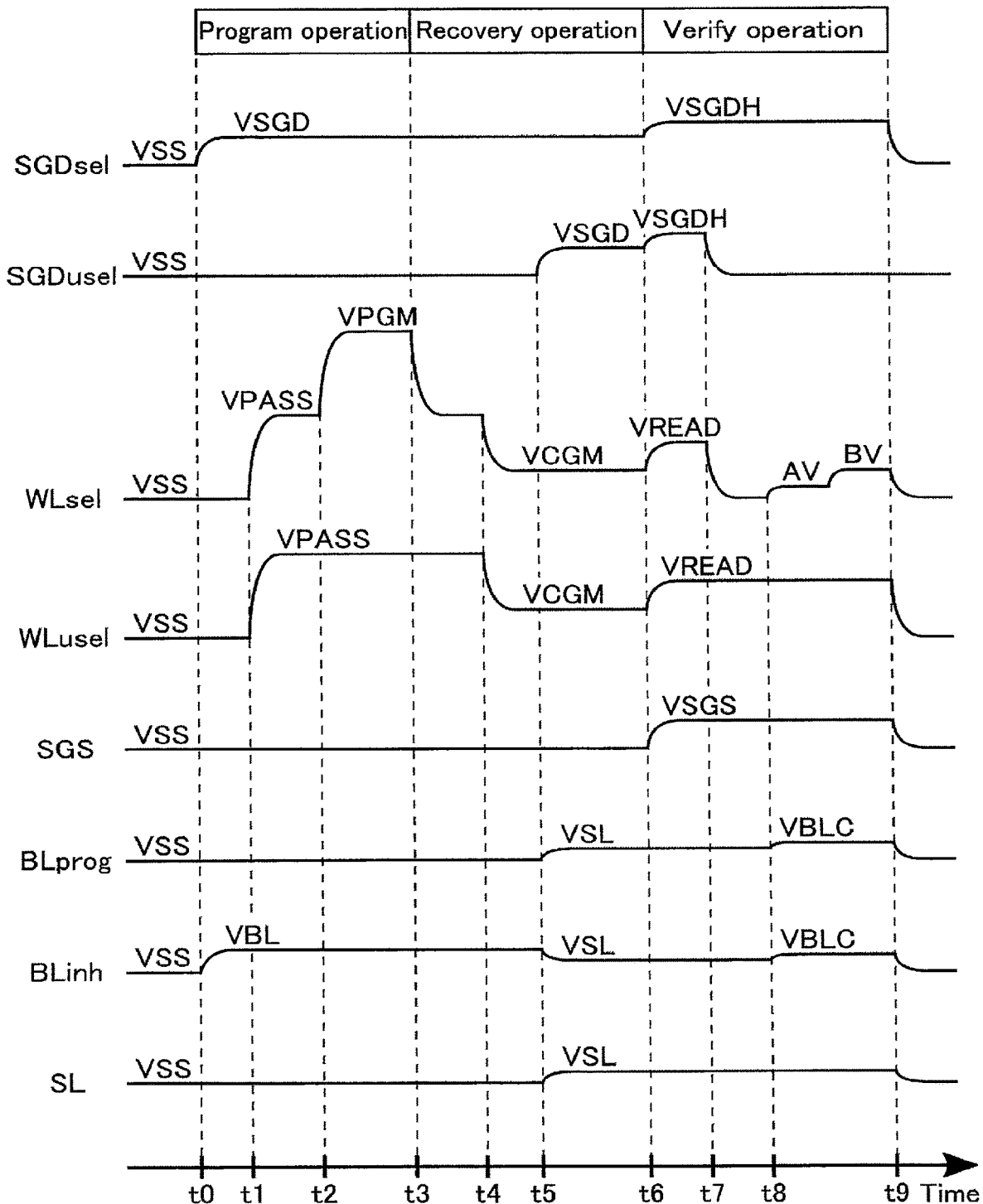
FIG. 21 is a timing chart illustrating an example of a program loop in a semiconductor memory device according to a third embodiment.

FIG. 21 illustrates an example of a timing chart of a program loop in the semiconductor memory device 1 according to the third embodiment. As illustrated in FIG. 21, the operation of the select gate line SGDusel at time t-5 differs between the program loop of the third embodiment and the program loop of the first embodiment.

Specifically, in the third embodiment, VSGD is applied to the select gate line SGDusel at time t5. That is, the voltage of the select gate line SGDusel has increased to VSGD before the start of a verify operation. Therefore, in the third embodiment, when VSGDH is applied to the select gate line SGDusel at time t6, the increase in the amount of the voltage at the select gate line SGDusel is smaller than that in the first embodiment. It suffices that the timing at which VSGD is applied to the select gate line SGDusel in the third embodiment is at minimum during a recovery operation. Also, it suffices that in the third embodiment, the voltage applied to the select gate line SGDusel is higher than VSS and equal to or lower than VSGDH. The other operations of the semiconductor memory device 1 according to the third embodiment are similar to those of the first embodiment.

[3-2] Advantageous Effects of Third Embodiment

As described above, in the semiconductor memory device 1 according to the third embodiment, the sequencer 13 executes the control of the select gate line SGDsel required for a verify operation during the recovery operation. Therefore, the semiconductor memory device 1 according to the third embodiment can make the time required for preparation of the verify operation shorter than that in the first embodiment. Therefore, the semiconductor memory device 1 according to the third embodiment can enhance the reliability of written data similarly to the first embodiment and can further shorten the time required for a verify operation.

[3-3] Modification of Third Embodiment

The above-mentioned recovery operation in the semiconductor memory device 1 according to the third embodiment allows various modifications. In the description below, program loops in the semiconductor memory device 1 according to the first and second modifications of the third embodiment will be described in sequence.

First Modification of Third Embodiment

Figure 22:
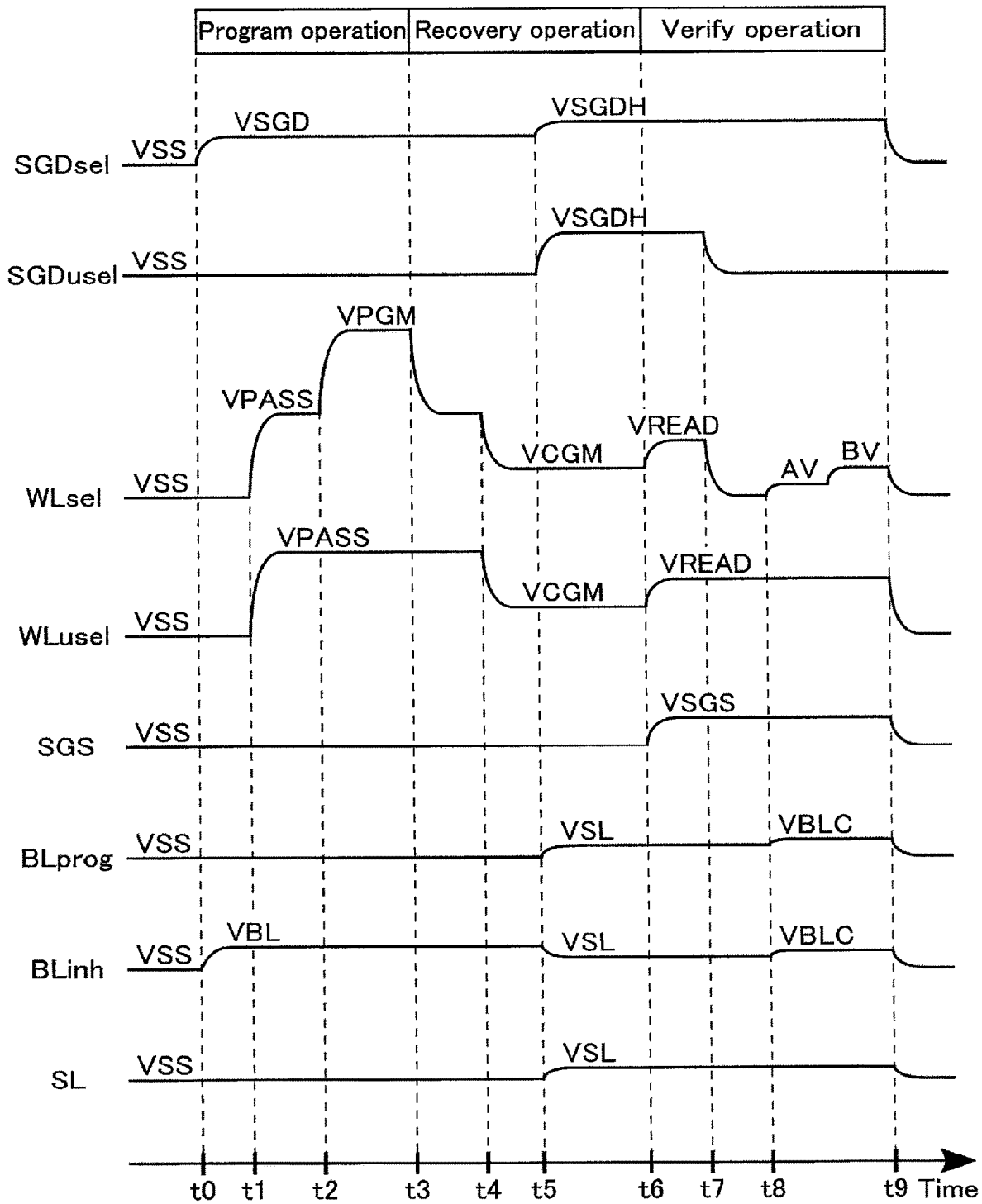
FIG. 22 is a timing chart illustrating an example of a program loop in a semiconductor memory device according to a first modification of the third embodiment.

FIG. 22 illustrates an example of a timing chart of a program loop in the semiconductor memory device 1 according to the first modification of the third embodiment. As illustrated in FIG. 22, the operation of the select gate line SGDsel at time t5 differs between the program loop in the first modification of the third embodiment and the program loop of the third embodiment.

Specifically, in the first modification of the third embodiment, VSGDH is applied to each of the select gate lines SGDsel and SGDusel at time t5. That is, in the first modification of the third embodiment, the timing at which VSGDH is applied to each of the select gate lines SGDsel and SGDusel is faster than that in the third embodiment. It suffices that the timing at which VSGDH is applied to each of the select gate lines SGDsel and SGDusel is at minimum during a recovery operation. The other operations of the semiconductor memory device 1 according to the first modification of the third embodiment are similar to those of the third embodiment.

In this way, in the first modification of the third embodiment, the sequencer 13 executes the control of the select gate lines SGDsel and SGDusel required for a verify operation during the recovery operation. As a result, the semiconductor memory device 1 according to the first modification of the third embodiment can obtain similar advantageous effects to those of the third embodiment and can further shorten the time required for a verify operation.

Second Modification of Third Embodiment

Figure 23:
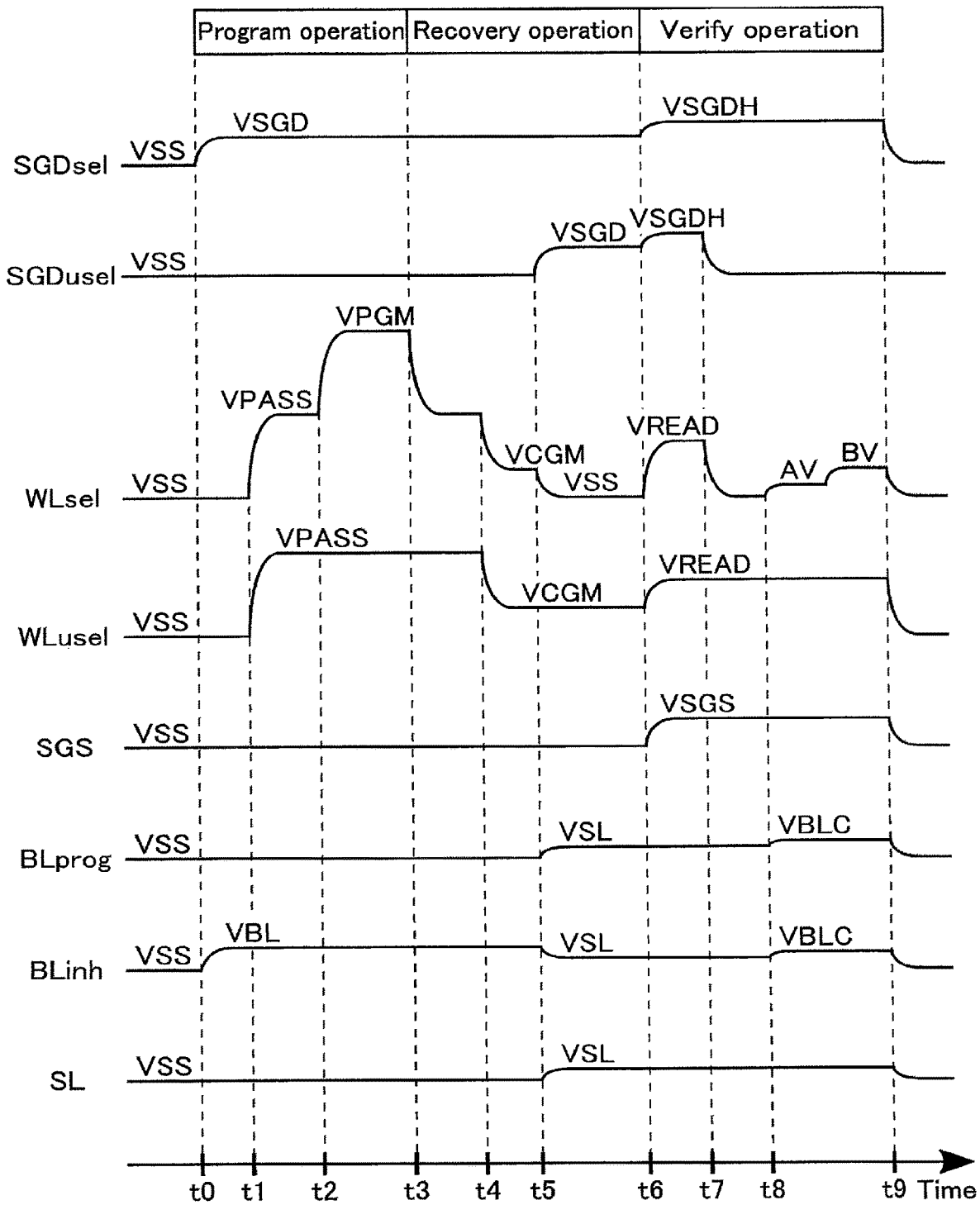
FIG. 23 is a timing chart illustrating an example of a program loop in a semiconductor memory device according to a second modification of the third embodiment.

FIG. 23 illustrates an example of a timing chart of a program loop in the semiconductor memory device 1 according to a second modification of the third embodiment. As illustrated in FIG. 23, the operation of the word line WLsel at time t5 differs between the program loop in the second modification of the third embodiment and the program loop of the third embodiment.

Specifically, in the second modification of the third embodiment, VSS is applied to the word line WLsel at time t5. That is, VSS is applied to the word line WLsel during the time VSGD and BSL are applied to the select gate lines SGDsel and the bit line BLprog, respectively. It suffices that the timing at which VSS is applied to the word line WLsel in the second modification of the third embodiment is at minimum during a recovery operation. The other operations of the semiconductor memory device 1 according to the third embodiment are similar to those of the third embodiment.

With this configuration, in the recovery operation in the second modification of the third embodiment, VSS is applied to the word line WLsel, whereby electrons trapped in the channel of the memory cell transistor MT that is coupled to the word line WLsel are easily detrapped. As a result, the semiconductor memory device 1 according to the second modification of the third embodiment can generate detrapping of electrons in the program target memory cell transistor MT during the recovery operation more stably than in the third embodiment. Therefore, the semiconductor memory device 1 according to the third modification of the second embodiment can make the width of the threshold distribution shorter than in the third embodiment and can further enhance the reliability of data written in the memory cell transistor MT.

[4] Fourth Embodiment

The configuration of a semiconductor memory device 1 according to a fourth embodiment is similar to that of the first embodiment. The semiconductor memory device 1 according to the fourth embodiment changes the method of a recovery operation in accordance with the progress of the program loop. A description will be given of the points in which the semiconductor memory device 1 according to the second embodiment differs from that according to the first embodiment.

[4-1] Write Operation of Semiconductor Memory Device 1

FIG. 24 illustrates an example of a flowchart of a write operation in a semiconductor memory device 1 according to a fourth embodiment. As illustrated in FIG. 24, in the write operation in the fourth embodiment, the sequencer 13 uses a first program loop including the recovery operation of the comparative example of the first embodiment and a second program loop including the recovery operation of the first embodiment selectively in accordance with the progress of the program loop.

Specifically, first, the sequencer 13 executes the first program loop including the recovery operation of the comparative example (step S10). Briefly, in the recovery operation of the comparative example, the sequencer 13 decreases the voltage of the select gate line SGDsel to VSS.

Then, the sequencer 13 confirms whether or not the program loop has been executed N times (step S11). Where the program loop has not been executed N times (step S11, NO), the sequencer 13 steps up the program voltage VPGM (step S12) and returns to the process of step S10. In contrast, where the program loop has been executed N times (step S11, YES), the sequencer 13 steps up the program voltage VPGM (step S13) and transfers to the process of step S14.

In the process of step S14, the sequencer 13 executes the second program loop including the recovery operation of the first embodiment. Briefly, in the recovery operation of the first embodiment, the sequencer 13 maintains the voltage of the select gate line SGDsel at VSGD.

Then, the sequencer 13 confirms whether or not it has passed the verification of all the states (step S15). Where it has not passed the verification of all the states (step S15, NO), the sequencer 13 steps up the program voltage VPGM (step S16) and returns to the process of step S14. In contrast, where the sequencer 13 has passed the verification of all the states (step S15, YES), the sequencer 13 ends the write operation.

[4-2] Advantageous Effects of Fourth Embodiment

For example, in the program loop, a decrease in the amount of the threshold voltage of the memory cell transistor MT during the recovery operation tends to increase as the write state gets higher. Therefore, the semiconductor memory device 1 according to the fourth embodiment changes in accordance with a change in write operation in the middle of the write operation.

Specifically, the semiconductor memory device 1 according to the fourth embodiment executes the recovery operation of the comparative example of the first embodiment in the first half of a write operation in which the influence of data retention in the program loop is small. Then, the semiconductor memory device 1 according to the fourth embodiment executes the recovery operation of the first embodiment in the last half of the write operation in which the influence of data retention in the program loop is large.

Since VSS is applied to the select gate line SGDsel in the recovery operation of the comparative example of the first embodiment, the power of the recovery operation of the comparative example of the first embodiment is lower than the consumption power of the recovery operation of the first embodiment. Therefore, the semiconductor memory device 1 according to the fourth embodiment can suppress the influence of data retention in the program loop and can suppress the consumption power more than the first embodiment.

It should be noted that in the fourth embodiment, a case is exemplified where the second program loop including the recovery operation of the first embodiment is executed after execution of the first program loop including the recovery operation of the comparative example; however, the execution of recovery operations is not limited thereto. For example, the sequencer 13 may execute any one of the recovery operations of the first to third modification of the first embodiment, the second embodiment, the first to third modifications of the second embodiment, the third embodiment, and the first and second modification of the third embodiment in place of the recovery operation of the first embodiment. Also, the sequencer 13 may execute a plurality of types of recovery operations out of these recovery operations.

In the fourth embodiment, a case is exemplified where the second program loop is executed after execution of the first program loop; however, the first program loop may be executed again after execution of the second program loop. In the fourth embodiment, it suffices that the sequencer 13 executes different program loops of recovery operations in accordance with at least the progress of the write operation and the characteristics of the memory cell transistor MT.

[5] Other Modifications

The above-mentioned embodiments and modifications can be combined to the extent possible. For example, the second embodiment and the third embodiment may be combined. The combination is not limited thereto, and the first to third modifications of the first embodiment, the second embodiment, the first to third modifications of the second embodiment, the third embodiment, and the first and second modifications of the third embodiment may be combined to the extent possible.

In the embodiments described above, the memory pillar MP may have a structure in which a plurality of pillars are coupled in the Z direction. For example, the memory pillar MP may have a structure in which a pillar penetrating through the conductive layer 52 (select gate line SGD) and a pillar penetrating through a plurality of conductive layers 51 (word lines WL) are coupled with each other. Moreover, the memory pillar MP may have a structure in which a plurality of pillars each penetrating through a plurality of conductive layers 51 are coupled with each other in the Z direction.

In the above-described embodiments, a case is exemplified where the memory cell array 10 is provided on the semiconductor substrate; however, the configuration of the semiconductor memory device 1 is not limited thereto. For example, the semiconductor memory device 1 may have a structure in which a circuit such as a sense amplifier module 16 is arranged beneath the memory cell array 10. Moreover, the semiconductor memory device 1 may have a structure in which a chip provided with the sense amplifier module 16, etc., and a chip provided with the memory cell array 10 are bonded together.

The timing chart used in the description of the read operation in the embodiments described above is only an example. For example, the timing at which the voltages of a signal and an interconnect at each time are controlled may deviate. In the above-described embodiments, the voltage applied to each interconnect within the memory cell array 10 may be estimated based on the voltage between the driver module 14 and the row decoder module 15. For example, the voltage applied to the word line WLsel can be estimated based on the voltage of a signal line CG. The voltage applied to the select gate line SGDsel can be estimated based on the voltage of a signal line SGDD.

In the specification of the present application, the voltage at an "H" level is a voltage at which an N-type MOS transistor having the gate to which said voltage is applied enters the ON state, and a P-type MOS transistor having the gate to which said voltage is applied enters the OFF state. The voltage at an "L" level is a voltage at which an N-type MOS transistor having the gate to which said voltage is applied enters the OFF state, and a P-type MOS transistor having the gate to which said voltage is applied enters the ON state. "One end of the transistor" indicates a drain or source of a MOS transistor. "The other end of the transistor" indicates a source or drain of the MOS transistor. "Select transistor ST1" may also be referred to as a drain select transistor. "Select transistor ST2" may also be referred to as a source select transistor.

In the present specification, the term "coupling" is intended to mean that elements are electrically coupled and does not exclude the case where another element is interposed therebetween. "OFF state" is intended to indicate that a voltage lower than the threshold voltage of a transistor is applied to the gate of the transistor, and does not exclude the case where a minute current such as a leakage current of the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
first and second drain select transistors;
first and second source select transistors;
first and second memory cell transistors coupled between the first drain select transistor and the first source select transistor;
third and fourth memory cell transistors coupled between the second drain select transistor and the second source select transistor;
first and second bit lines coupled to the first and second drain select transistors, respectively;
a first select gate line coupled to the first drain select transistor;
a second select gate line coupled to the second drain select transistor;
a third select gate line coupled to the first and second source select transistors;
a first word line coupled to the first and third memory cell transistors;
a second word line coupled to the second and fourth memory cell transistors; and
a controller configured to execute a write operation including multiple iterations of a program loop, wherein
the controller is configured to execute, in the program loop, a program operation, a recovery operation and a verify operation in sequence, and
in the write operation of the first memory cell transistor, the controller is configured, at a first time of the recovery operation, to:
apply a first voltage to the first select gate line;
apply a second voltage which is lower than the first voltage to the third select gate line; and
apply a third voltage between the first voltage and the second voltage to the first bit line,
the first word line and the second word line being provided apart from each other above a substrate in a direction intersecting with a surface of the substrate.

2. The device of claim 1, further comprising:
a first conductive layer provided above the substrate;
a second conductive layer provided above the first conductive layer;
third and fourth conductive layers provided above the second conductive layer;
fifth and sixth conductive layers provided above the third and fourth conductive layers, respectively;
a first pillar provided penetrating through the first, second, third and fifth conductive layers; and
a second pillar provided penetrating through the first, second, fourth and sixth conductive layers, wherein
the first conductive layer functions as the first word line,
the second conductive layer functions as the second word line,
the third and fifth conductive layers function as the first select gate line, and
the fourth and sixth conductive layers function as the second select gate line.

3. The device of claim 2, wherein
the controller is configured to execute the write operation in the order of the first word line and the second word line.

4. The device of claim 1, wherein
the controller is configured, at the first time, to apply the second voltage to the second select gate line, apply a fourth voltage which is higher than the second voltage and lower than a program voltage to the first word line, apply a fifth voltage which is higher than the second voltage and lower than the program voltage to the second word line, and apply the third voltage to the second bit line.

5. The device of claim 4, wherein
the controller is configured to apply a sixth voltage which is higher than each of the fourth voltage and the fifth voltage and lower than the program voltage to the second word line, when the program voltage is applied to the first word line in the program operation.

6. The device of claim 1, wherein
the controller is configured to apply a seventh voltage which is higher than the second voltage and lower than the first voltage to the first select gate line, when a program voltage is applied to the first word line in the program operation.

7. The device of claim 1, wherein
the controller is configured, at the first time, to apply the second voltage to the first word line and apply a fifth voltage which is higher than the second voltage and lower than a program voltage to the second word line.

8. The device of claim 1, wherein
the controller is configured to decrease the voltage of the first and second bit lines from the third voltage to an eighth voltage which is between the second voltage and the third voltage at the time of starting the verify operation.

9. The device of claim 8, wherein
the controller is configured to apply a seventh voltage which is higher than the second voltage and lower than the first voltage to the first select gate line, when a program voltage is applied to the first word line in the program operation.

10. The device of claim 8, wherein
the controller is configured, at the first time, to apply the second voltage to the first word line and apply a fifth voltage which is higher than the second voltage and lower than a program voltage to the second word line.

11. The device of claim 1, wherein
the controller is configured, at the first time, to apply the first voltage to the second select gate line, apply a fourth voltage which is higher than the second voltage and lower than a program voltage to the first word line, and apply a fifth voltage which is higher than the second voltage and lower than the program voltage to the second word line.

12. The device of claim 11, wherein
the controller is configured to apply a seventh voltage which is higher than the second voltage and lower than the first voltage to the first select gate line, when the program voltage is applied to the first word line in the program operation.

13. The device of claim 1, wherein
the controller is configured, at the first time, to apply the first voltage to the second select gate line, apply the second voltage to the first word line, and apply a fifth voltage which is higher than the second voltage and lower than a program voltage to the second word line.

14. The device of claim 1, wherein
the controller is configured to:
apply the second voltage to both the first select gate line and the third select gate line at a second time in the recovery operation in a program loop from a first iteration to an Nth iteration (N is an integer of 1 or more) out of the multiple iterations of the program loop, and
execute control of the first time in the recovery operation in a program loop of N+1 or subsequent iterations out of the multiple iterations of the program loop.

15. A semiconductor memory device comprising:
first and second drain select transistors;
first and second source select transistors;
first and second memory cell transistors coupled between the first drain select transistor and the first source select transistor;
third and fourth memory cell transistors coupled between the second drain select transistor and the second source select transistor;
a first select gate line coupled to the first drain select transistor;
a second select gate line coupled to the second drain select transistor;
a third select gate line coupled to the first and second source select transistors;
a first word line coupled to the first and third memory cell transistors;
a second word line coupled to the second and fourth memory cell transistors; and
a source line coupled to the first and second source select transistors, respectively; and
a controller configured to execute a write operation including a program loop for multiple iterations, wherein
in the program loop, the controller is configured to execute a program operation, a recovery operation and a verify operation in sequence,
in the write operation of the first memory cell transistor, the controller is configured to apply a first voltage to the third select gate line, apply a second voltage which is lower than the first voltage to the first select gate line, and apply a third voltage between the first voltage and the second voltage to the source line, at a first time of the recovery operation.

16. The device of claim 15, further comprising:
a first conductive layer provided above a substrate;
a second conductive layer provided above the first conductive layer;
a third conductive layer provided above the second conductive layer;
a fourth conductive layer provided above the third conductive layer;
fifth and sixth conductive layers provided above the fourth conductive layer;
a first pillar provided penetrating through the first, second, third, fourth and fifth conductive layers; and
a second pillar provided penetrating through the first, second, third, fourth and sixth conductive layers; wherein
the first and second conductive layers function as the first word line,
the third conductive layer functions as the first word line;
the fourth conductive layer functions as the second word line,
the fifth conductive layer functions as the first select gate line, and
the sixth conductive layer functions as the second select gate line.

17. The device of claim 16, wherein
the controller is configured to execute a write operation in the order of the second word line and the first word line.

18. The device of claim 15, wherein
the controller is configured, at the first time, to apply the second voltage to the second select gate line, apply a fourth voltage which is higher than the second voltage and lower than a program voltage to the first word line, and apply a fifth voltage which is higher than the second voltage and lower than the program voltage to the second word line.

19. The device of claim 15, wherein
a voltage applied to the source line in the verify operation is lower than the third voltage.

20. The device of claim 15, wherein
the controller is configured to:
apply the second voltage to both the first select gate line and the third select gate line at a second time in the recovery operation in a program loop from a first iteration to an Nth iteration (N is an integer of 1 or more) out of the multiple iterations of the program loop, and
execute control of the first time in the recovery operation in a program loop of N+1 or subsequent iterations out of the multiple iterations of the program loop.

* * * * *